(12) United States Patent
Iijima

(10) Patent No.: US 12,433,043 B2
(45) Date of Patent: Sep. 30, 2025

(54) IMAGING DEVICE INCLUDING MULTIPLE PHOTOELECTRIC CONVERSION LAYERS, MULTIPLE PIXEL ELECTRODES AND PLUGS CONNECTING SUBSTRATE AND THE PIXEL ELECTRODES

(71) Applicant: Panasonic Intellectual Property Management Co., Ltd., Osaka (JP)

(72) Inventor: Hiroaki Iijima, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 515 days.

(21) Appl. No.: 17/494,202

(22) Filed: Oct. 5, 2021

(65) Prior Publication Data

US 2022/0028918 A1    Jan. 27, 2022

Related U.S. Application Data

(63) Continuation of application No. PCT/JP2020/016233, filed on Apr. 13, 2020.

(30) Foreign Application Priority Data

Apr. 26, 2019   (JP) .................................. 2019-086524
Mar. 27, 2020   (JP) .................................. 2020-058610

(51) Int. Cl.
     *H10F 39/18*      (2025.01)
     *H10F 39/00*      (2025.01)

(52) U.S. Cl.
     CPC ..... *H10F 39/1847* (2025.01); *H10F 39/1825* (2025.01); *H10F 39/8033* (2025.01);
(Continued)

(58) Field of Classification Search
     CPC ......... H01L 31/0224; H01L 31/022466; H01L 31/022475; H01L 31/022483;
(Continued)

(56) References Cited

U.S. PATENT DOCUMENTS

2005/0219392 A1    10/2005   Suzuki
2005/0264662 A1    12/2005   Suzuki et al.
(Continued)

FOREIGN PATENT DOCUMENTS

CN    107786822 A    3/2018
EP    3833015 A1    6/2021
(Continued)

OTHER PUBLICATIONS

International Search Report of PCT application No. PCT/JP2020/016233 dated Jun. 30, 2020.
(Continued)

*Primary Examiner* — Eliseo Ramos Feliciano
*Assistant Examiner* — William Henry Anderson
(74) *Attorney, Agent, or Firm* — Rimon P.C.

(57) ABSTRACT

An imaging device includes a semiconductor substrate, a first pixel, and second pixels adjacent to the first pixel. Each of the first pixel and the second pixels includes a first photoelectric conversion layer, a first pixel electrode, a first plug that electrically connects the semiconductor substrate and the first pixel electrode, a second photoelectric conversion layer, a second pixel electrode, and a second plug that electrically connects the semiconductor substrate and the second pixel electrode. When the imaging device is viewed in a normal direction of the semiconductor substrate, a smallest distance of distances between the first plug in the first pixel and the first plugs in the respective second pixels is smaller than a smallest distance of distances between the
(Continued)

first plug in the first pixel and the second plugs in the first pixel and the respective second pixels.

17 Claims, 21 Drawing Sheets

(52) U.S. Cl.
CPC ........ *H10F 39/811* (2025.01); *H10F 39/8053* (2025.01); *H10F 39/8063* (2025.01)

(58) Field of Classification Search
CPC ....... H01L 31/022491; H01L 27/14636; H01L 27/1462; H01L 27/14621; H01L 31/02162; H01L 31/02164; H01L 27/14647; H01L 27/14652; H01L 27/1465; H01L 27/14667; H01L 27/14669; H01L 27/1467
See application file for complete search history.

(56) References Cited

U.S. PATENT DOCUMENTS

| | | |
|---|---|---|
| 2011/0220778 A1 | 9/2011 | Inaba |
| 2012/0204960 A1 | 8/2012 | Kato et al. |
| 2012/0313142 A1 | 12/2012 | Suzuki et al. |
| 2015/0144904 A1 | 5/2015 | Jeong et al. |
| 2016/0240571 A1 | 8/2016 | Baek |
| 2016/0360134 A1 | 12/2016 | Miyake |
| 2017/0148841 A1* | 5/2017 | Matsumoto ....... H01L 27/14636 |
| 2017/0163917 A1 | 6/2017 | Yamada et al. |
| 2017/0263669 A1 | 9/2017 | Tamaki et al. |
| 2018/0013961 A1* | 1/2018 | Lee ......... H04N 23/11 |
| 2018/0063456 A1 | 3/2018 | Lee |
| 2019/0019823 A1* | 1/2019 | Ooki ................ H01L 27/14647 |
| 2019/0043911 A1* | 2/2019 | Honda ................ H01L 21/7682 |
| 2019/0173032 A1* | 6/2019 | Park .................... H10F 39/1825 |
| 2019/0214417 A1 | 7/2019 | Matsuo et al. |
| 2019/0260952 A1* | 8/2019 | Lee .................. H01L 27/14603 |
| 2020/0029038 A1 | 1/2020 | Uesugi et al. |
| 2020/0076999 A1 | 3/2020 | Akiyama et al. |
| 2021/0249474 A1 | 8/2021 | Togashi et al. |
| 2022/0020819 A1* | 1/2022 | Kaneda ............... H10F 39/8053 |

FOREIGN PATENT DOCUMENTS

| | | |
|---|---|---|
| JP | 2002-083946 | 3/2002 |
| JP | 2005-268471 | 9/2005 |
| JP | 2005-268471 A | 9/2005 |
| JP | 2005-340572 A | 12/2005 |
| JP | 2006-093521 A | 4/2006 |
| JP | 2006-210397 A | 8/2006 |
| JP | 2008-288404 | 11/2008 |
| JP | 2009-054806 A1 | 3/2009 |
| JP | 2011-119694 | 6/2011 |
| JP | 2011-187725 A | 9/2011 |
| JP | 2011-238781 | 11/2011 |
| JP | 2013-055252 A | 3/2013 |
| JP | 2016-096233 | 5/2016 |
| JP | 2016-152417 A | 8/2016 |
| JP | 2018-046039 A | 3/2018 |
| WO | 2011/141974 | 11/2011 |
| WO | 2016/002576 A1 | 1/2016 |
| WO | 2018/173754 | 9/2018 |
| WO | 2018/190126 A1 | 10/2018 |
| WO | 2019/240121 | 12/2019 |
| WO | 2020/026720 A1 | 2/2020 |

OTHER PUBLICATIONS

International Search Report of PCT application No. PCT/JP2020/016235 dated Jun. 23, 2020.
International Search Report of PCT application No. PCT/JP2020/016232 dated Jun. 30, 2020.
Non-Final Office Action dated Mar. 15, 2024 issued in U.S. Appl. No. 17/483,655.
Non-Final Office Action dated Mar. 18, 2024 issued in U.S. Appl. No. 17/474,521.
English Translation of Chinese Search Report dated Feb. 6, 2025 for the related Chinese Patent Application No. 202080016279.6.

* cited by examiner

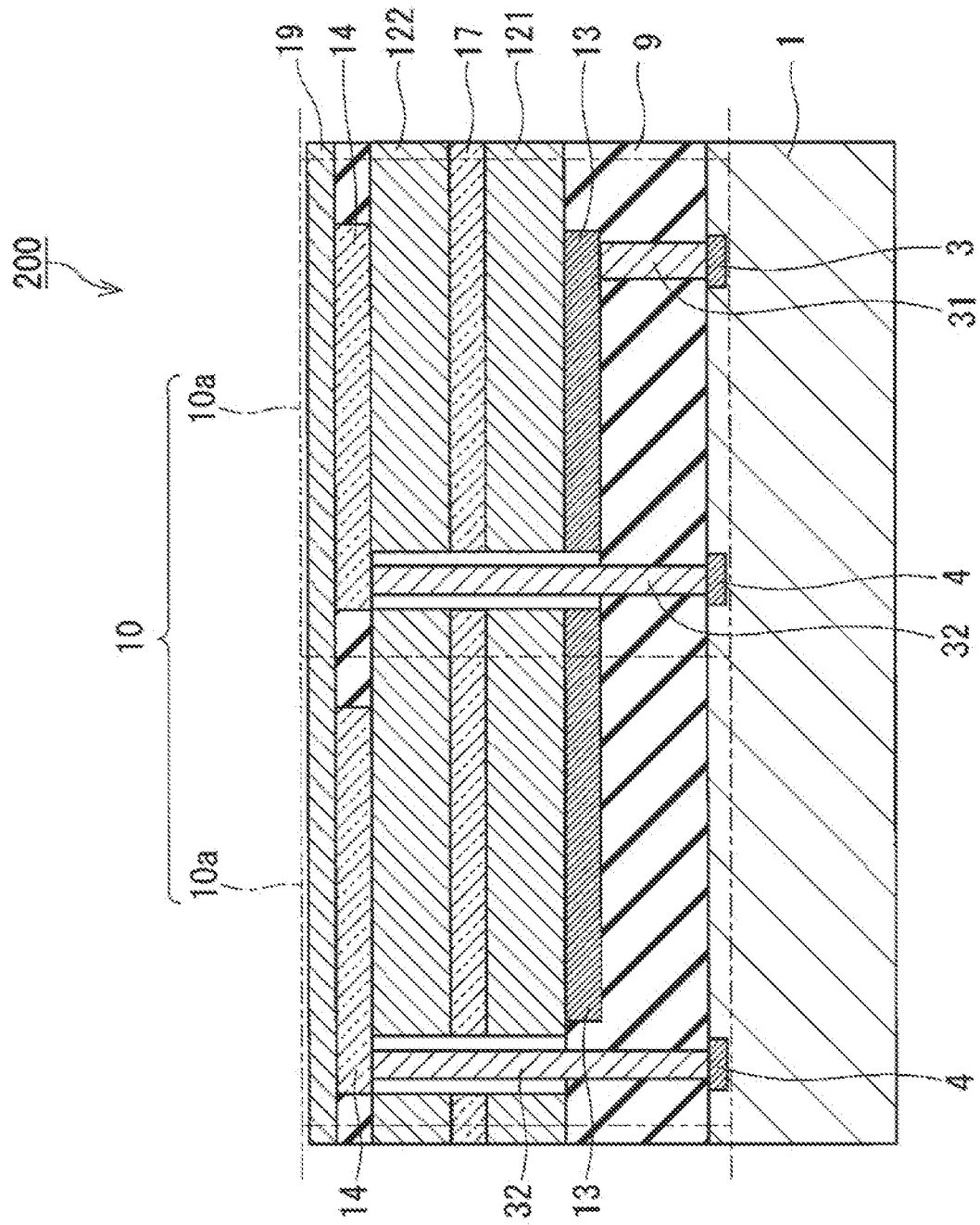

IMAGING DEVICE INCLUDING MULTIPLE PHOTOELECTRIC CONVERSION LAYERS, MULTIPLE PIXEL ELECTRODES AND PLUGS CONNECTING SUBSTRATE AND THE PIXEL ELECTRODES

BACKGROUND

1. Technical Field

The present disclosure relates to imaging devices.

2. Description of the Related Art

Imaging devices utilizing photoelectric conversion have been widely used. The imaging devices typically have sensitivity to wavelength ranges corresponding to respective colors red (R), green (G), and blue (B). Signals of R components, signals of G components, and signals of B components are taken out from the imaging devices. Imaging devices having sensitivity to the wavelength range of near infrared light may be used for security cameras and vehicle-mounted cameras.

Nowadays, the sizes of pixels in imaging devices tend to be decreasing as the densities of the pixels increase, and the areas of photoelectric converters, such as photodiodes, are also decreasing.

Japanese Unexamined Patent Application Publication No. 2005-268471 discloses an imaging device having a plurality of photoelectric conversion films.

SUMMARY

In one general aspect, the techniques disclosed here feature an imaging device including: a semiconductor substrate; a first pixel; and second pixels that are adjacent to the first pixel. Each of the first pixel and the second pixels includes: a first photoelectric conversion layer that converts light having a wavelength included in a first wavelength range into first charge; a first pixel electrode that collects the first charge; a first plug that electrically connects the semiconductor substrate and the first pixel electrode; a second photoelectric conversion layer that is arranged above the first photoelectric conversion layer or between the first photoelectric conversion layer and the semiconductor substrate in a normal direction of the semiconductor substrate and that converts light in a wavelength included in a second wavelength range into second charge; a second pixel electrode that collects the second charge; and a second plug that electrically connects the semiconductor substrate and the second pixel electrode. When viewed in the normal direction of the semiconductor substrate, a smallest distance of distances between the first plug in the first pixel and a plurality of first plugs in the second pixels is smaller than a smallest distance of distances between the first plug in the first pixel and a plurality of second plugs in the first pixel and the second pixels, each of the plurality of first plugs being the first plug in a corresponding one of the second pixels, each of the plurality of second plugs being the second plug in the first pixel or the second plug in a corresponding one of the second pixels.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 is a sectional view of an imaging device according to a second embodiment of the present disclosure;

DETAILED DESCRIPTION

Findings Underlying the Present Disclosure

Figure 1:
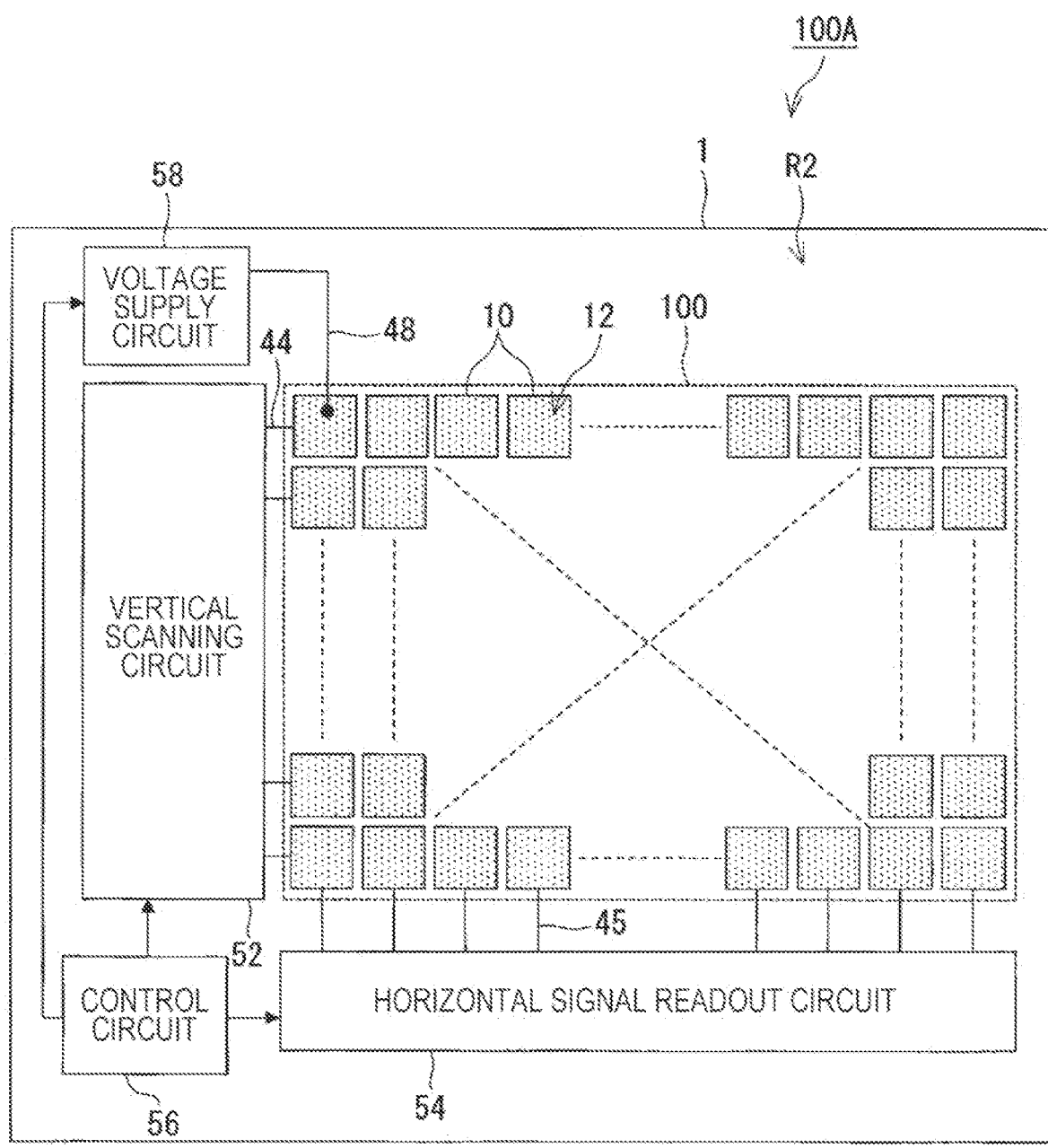
FIG. 1 is a diagram illustrating a configuration of an imaging apparatus according to a first embodiment of the present disclosure.

Imaging devices each have a semiconductor substrate and a photoelectric conversion film arranged at an upper side thereof, for example, as disclosed in Japanese Unexamined Patent Application Publication No. 2011-238781. In recent years, imaging devices having a laminated structure of photoelectric conversion films have been proposed (e.g., see Japanese Unexamined Patent Application Publication No. 2005-268471) in order to further increase the density of pixels.

The present inventors have conducted studies on causes of hampering improvement of the image quality of the imaging devices. As a result, the present inventors have found the following problems.

The imaging devices each have plugs that connect pixel electrodes and a semiconductor substrate. As the density of pixels increases, crosstalk between the plugs becomes obvious. The crosstalk between the plugs causes color mixing in an image to be acquired. For example, when crosstalk occurs between plugs corresponding to different colors, such as R and G, G and B, and B and R, a color difference between a subject and an image acquired becomes prominent. Suppressing the crosstalk between the plugs is beneficial in improving the image quality.

The crosstalk between the plugs is presumed to become obvious in the imaging device having the structure disclosed in Japanese Unexamined Patent Application Publication No. 2005-268471.

The present disclosure provides a technology for suppressing the crosstalk between plugs.

Overview of One Aspect According to the Present Disclosure

An imaging device according to a first aspect of the present disclosure includes:
  a semiconductor substrate;
  a first pixel; and
  second pixels that are adjacent to the first pixel.
  Each of the first pixel and the second pixels includes:
    a first photoelectric conversion layer that converts light having a wavelength included in a first wavelength range into first charge;
    a first pixel electrode that collects the first charge;
    a first plug that electrically connects the semiconductor substrate and the first pixel electrode;
    a second photoelectric conversion layer that is arranged above the first photoelectric conversion layer or between the first photoelectric conversion layer and the semiconductor substrate in a normal direction of the semiconductor substrate and that converts light in a wavelength included in a second wavelength range into second charge;
    a second pixel electrode that collects the second charge; and
    a second plug that electrically connects the semiconductor substrate and the second pixel electrode.

When viewed in the normal direction of the semiconductor substrate, a smallest distance of distances between the first plug in the first pixel and a plurality of first plugs in the respective second pixels is smaller than a smallest distance of distances between the first plug in the first pixel and a plurality of second plugs in the first pixel and the respective second pixels, each of the plurality of first plugs being the first plug in a corresponding one of the second pixels, each of the plurality of second plugs being the second plug in the first pixel or the second plug in a corresponding one of the second pixels.

According to this configuration, it is possible to suppress crosstalk between plugs corresponding to different colors. This makes it possible to suppress color mixing between the pixels.

The second pixels may include
  a pixel that is adjacent to the first pixel in a first direction,
  a pixel that is adjacent to the first pixel in a direction opposite to the first direction,
  a pixel that is adjacent to the first pixel in a second direction orthogonal to the first direction,
  a pixel that is adjacent to the first pixel in a direction opposite to the second direction,
  a pixel that is adjacent to the first pixel in a third direction between the first direction and the second direction,
  a pixel that is adjacent to the first pixel in a direction opposite to the third direction,
  a pixel that is adjacent to the first pixel in a fourth direction orthogonal to the third direction, and
  a pixel that is adjacent to the first pixel in a direction opposite to the fourth direction.

In a second aspect of the present disclosure, for example, in the imaging device according to the first aspect, the second photoelectric conversion layer may be arranged above the first photoelectric conversion layer in the normal direction of the semiconductor substrate. According to this configuration, since the first plug can be made shorter than the second plug, it is possible to suppress crosstalk between the first plugs, while suppressing crosstalk between the first plug and the second plug.

In a third aspect of the present disclosure, for example, in the imaging device according to the second aspect, the first wavelength range may be a wavelength range of near infrared light, and the second wavelength range may be a wavelength range of visible light. According to this configuration, it is possible to suppress mixing of information on visible light and information on near infrared light.

In a fourth aspect of the present disclosure, for example, in the imaging device according to the first aspect, the second photoelectric conversion layer may be arranged between the first photoelectric conversion layer and the semiconductor substrate in the normal direction of the semiconductor substrate. According to this configuration, since the second plug can be made shorter than the first plug, it is possible to suppress crosstalk between the second plugs, while suppressing crosstalk between the first plug and the second plug.

In a fifth aspect of the present disclosure, for example, in the imaging device according to the fourth aspect, the first wavelength range may be a wavelength range of visible light, and the second wavelength range may be a wavelength range of near infrared light. According to this configuration, it is possible to suppress mixing of information on visible light and information on near infrared light.

According to a sixth aspect of the present disclosure, for example, in the imaging device according to the fourth or fifth aspect, the first plug does not necessarily have to overlap the second pixel electrode, when viewed in the normal direction of the semiconductor substrate. According to this configuration, it is possible to reduce variations in the thickness of the second photoelectric conversion layer, surface roughness of the second photoelectric conversion layer, and so on.

According to a seventh aspect of the present disclosure, for example, in the imaging device according to one of the fourth to sixth aspects, an area of the second pixel electrode may be smaller than four times an area of the first pixel electrode, when viewed in the normal direction of the semiconductor substrate. According to this configuration, the second pixel electrode can be formed, avoiding the first plug.

In an eighth aspect of the present disclosure, for example, in the imaging device according to the first aspect, the first wavelength range may include a wavelength range of red light and a wavelength range of blue light, the second wavelength range may include a wavelength range of green light, the first photoelectric conversion layer may have sensitivity to the wavelength range of red light and the wavelength range of blue light, and the second photoelectric conversion layer may have sensitivity to the wavelength range of green light. According to this configuration, it is possible to increase the area of green sub-pixels having a high luminosity factor, while ensuring advantages of a multi-layer structure.

In a ninth aspect of the present disclosure, for example, the imaging device according to the eighth aspect may further include: a first color filter that cuts light in the wavelength range of red light; and a second color filter that cuts light in the wavelength range of blue light. According to this configuration, it is possible to provide the imaging device with sensitivity to the wavelength range of blue light, the wavelength range of red light, and the wavelength range of green light, while ensuring advantages of the multi-layer structure. This makes it possible to acquire full-color images.

In a tenth aspect of the present disclosure, for example, in the imaging device according to the first aspect, each of the first pixel and the second pixels may further include: a third photoelectric conversion layer that converts light having a wavelength included in a third wavelength range into third charge; a third pixel electrode that collects the third charge; and a third plug that electrically connects the semiconductor substrate and the third pixel electrode. When viewed in the normal direction of the semiconductor substrate, the smallest distance of the distances between the first plug in the first pixel and the plurality of first plugs in the respective second pixels may be smaller than a smallest distance of distances between the first plug in the first pixel and a plurality of third plugs in the respective second pixels, each of the plurality of third plugs being the third plug in a corresponding one of the second pixels. According to this configuration, color separation can be enhanced.

An imaging device according to an 11th aspect of the present disclosure includes:
a semiconductor substrate;
two first pixels that are adjacent to each other; and
a second pixel that is adjacent to each of the two first pixels.

Each of the two first pixels includes
a first photoelectric conversion layer that converts light having a wavelength included in a first wavelength range into first charge,
a first pixel electrode that collects the first charge, and
a first plug that electrically connects the semiconductor substrate and the first pixel electrode.
The second pixel includes
a second photoelectric conversion layer that converts light having a wavelength included in a second wavelength range into second charge,
a second pixel electrode that collects the second charge, and
a second plug that electrically connects the semiconductor substrate and the second pixel electrode.
When viewed in a normal direction of the semiconductor substrate, a distance between the first plug in one of the two first pixels and the first plug in the other of the two first pixels is smaller than a distance between the first plug in one of the two first pixels and the second plug in the second pixel.

According to this configuration, it is possible to suppress crosstalk between the plugs corresponding to different colors. Thus, color mixing between the pixels can be suppressed.

In a 12th aspect of the present disclosure, for example, the imaging device according to the 11th aspect may further include a third pixel that is adjacent to each of the two first pixels. The third pixel may include a third photoelectric conversion layer that converts light having a wavelength included in a third wavelength range into third charge, a third pixel electrode that collects the third charge, and a third plug that electrically connects the semiconductor substrate and the third pixel electrode. When viewed in the normal direction of the semiconductor substrate, the distance between the first plug in one of the two first pixels and the first plug in the other of the two first pixels may be smaller than a distance between the first plug in one of the two first pixels and the third plug in the third pixel. According to this configuration, crosstalk between the first plug in the first pixel and the third plug in the third pixel is suppressed.

According to a 13th aspect of the present disclosure, for example, in the imaging device according to the 12th aspect, the two first pixels, the second pixel, and the third pixel may be arrayed in a Bayer arrangement. The imaging device in the 13th aspect can acquire full-color images.

In a 14th aspect of the present disclosure, for example, in the imaging device according to one of the 11th to 13th aspects, the first wavelength range may be a wavelength range of green light.

An imaging device according to a 15th aspect of the present disclosure includes:
a semiconductor substrate;
at least one photoelectric conversion layer;
a first pixel electrode that is electrically connected to the at least one photoelectric conversion layer and that collects charge corresponding to light in a first wavelength range;
a first plug that provides electrical connection between the semiconductor substrate and the first pixel electrode;
a second pixel electrode that is electrically connected to the at least one photoelectric conversion layer and that collects charge corresponding to light in a second wavelength range;
a second plug that provides electrical connection between the semiconductor substrate and the second pixel electrode;

a third pixel electrode that is electrically connected to the at least one photoelectric conversion layer to collect charge corresponding to light in a third wavelength range; and a third plug that provides electrical connection between the semiconductor substrate and the third pixel electrode.

When viewed in a normal direction of the semiconductor substrate, a distance between the first plug and the third plug is smaller than a distance between the first plug and the second plug.

According to this configuration, it is possible to suppress crosstalk between the plugs corresponding to different colors. Thus, color mixing between the pixels can be suppressed.

In a 16th aspect of the present disclosure, for example, in the imaging device according to one of the first to 15th aspects, the first pixel electrode may include a first accumulation electrode that causes the first charge to be accumulated at the first photoelectric conversion layer, and a first readout electrode that is electrically connected to the semiconductor substrate via the first plug; and the second pixel electrode may include a second accumulation electrode that causes the second charge to be accumulated at the second photoelectric conversion layer, and a second readout electrode that is electrically connected to the semiconductor substrate via the second plug.

An imaging device according to a 17th aspect of the present disclosure includes:
a semiconductor substrate; and
pixels.
Each of the pixels includes:
a first photoelectric conversion layer;
a first pixel electrode that collects charge corresponding to light in a first wavelength range, the charge being generated in the first photoelectric conversion layer;
a first plug that provides electrical connection between the semiconductor substrate and the first pixel electrode;
a second photoelectric conversion layer that is arranged above the first photoelectric conversion layer or between the first photoelectric conversion layer and the semiconductor substrate in a normal direction of the semiconductor substrate;
a second pixel electrode that collects charge corresponding to light in a second wavelength range, the charge being generated in the second photoelectric conversion layer; and
a second plug that provides electrical connection between the semiconductor substrate and the second pixel electrode.

In the pixels that are adjacent to each other, a distance between the first plugs is smaller than a distance between the first plug and the second plug, when the imaging device is viewed in a normal direction of the semiconductor substrate.

According to this configuration, it is possible to suppress crosstalk between the plugs corresponding to different colors. Thus, color mixing between the pixels can be suppressed.

An imaging device according to an 18th aspect of the present disclosure includes:
a semiconductor substrate; and
pixels.
The pixels include first pixels and second pixels.
Each of the first pixels includes a first photoelectric conversion layer, a first pixel electrode that collects charge correspond to light in a first wavelength range, the charge being generated in the first photoelectric conversion layer, and a first plug that provides electrical connection between the semiconductor substrate and the first pixel electrode.

Each of the second pixels includes a second photoelectric conversion layer, a second pixel electrode that collects charge corresponding to light in a second wavelength range, the charge being generated in the second photoelectric conversion layer, and a second plug that provides electrical connection between the semiconductor substrate and the second pixel electrode.

In the pixels that are adjacent to each other, a distance between the first plugs is smaller than a distance between the first plug and the second plug, when viewed in a normal direction of the semiconductor substrate.

According to this configuration, it is possible to suppress crosstalk between the plugs corresponding to different colors. Thus, color mixing between the pixels can be suppressed. An imaging device according to a 19th aspect of the present disclosure includes: a semiconductor substrate; and a plurality of pixels, wherein each of the plurality of pixels includes two first photoelectric conversion layers, a second photoelectric conversion layer that is arranged above the two first photoelectric conversion layers or between the two first photoelectric conversion layers and the semiconductor substrate, a third photoelectric conversion layer that is adjacent to each of the two first photoelectric conversion layers, and a fourth photoelectric conversion layer that is adjacent to each of the two first photoelectric conversion layers, and when viewed in a normal direction of the semiconductor substrate, the second photoelectric conversion layer overlaps the two first photoelectric conversion layers, the third photoelectric conversion layer, and the fourth photoelectric conversion layer. In a 20th aspect of the present disclosure, for example, in the imaging device according to the 19th aspect, the two first photoelectric conversion layers, the third photoelectric conversion layer, and the fourth photoelectric conversion layer may be arranged in a Bayer arrangement. In a 21th aspect of the present disclosure, for example, in the imaging device according to the 19th aspect, the second photoelectric conversion layer may convert near infrared light into charge.

Embodiments of the present disclosure will be described below with reference to the accompanying drawings. The present disclosure is not limited to the embodiments described below.

First Embodiment

FIG. 1 illustrates a configuration of an imaging apparatus 100A according to a first embodiment of the present disclosure. The imaging apparatus 100A includes an imaging device 100. The imaging device 100 includes a semiconductor substrate 1 and a plurality of pixels 10. The plurality of pixels 10 is provided at the semiconductor substrate 1. The pixels 10 are supported by the semiconductor substrate 1. The pixels 10 may be partly constituted by the semiconductor substrate 1.

The semiconductor substrate 1 can be a circuit substrate including various electronic circuits. The semiconductor substrate 1 is implemented by, for example, a silicon (Si) substrate.

The pixels 10 include photoelectric converters 12, respectively. Upon receiving incident light, each photoelectric converter 12 generates positive charge and negative charge, typically, hole-electron pairs. Each photoelectric converter 12 includes at least one photoelectric conversion layer arranged at an upper side of the semiconductor substrate 1. In FIG. 1, the photoelectric converters 12 in the pixels 10 are illustrated spatially separately from one another. This, however, is for merely convenience of description. The photoelectric converters 12 in the pixels 10 can be continuously arranged at the semiconductor substrate 1, without gaps being interposed between the photoelectric converters 12. In other words, the photoelectric converters 12 in the adjacent pixels 10 can be electrically connected to each other.

In FIG. 1, the pixels 10 are arrayed in a plurality of rows by a plurality of columns, that is, m rows by n columns, where m and n individually represent integers greater than or equal to 1. The pixels 10 are, for example, two-dimensionally arrayed at the semiconductor substrate 1 to form an imaging region. When the imaging apparatus 100A is viewed in plan view, the imaging device 100 can be defined as a region in which at least one photoelectric conversion layer lies.

In the pixels arrayed in the m rows by n columns, when the pixels arranged in x rows by y columns are represented by (x, y), the pixels that are adjacent to (x, y) are represented by (x−1, y−1), (x, y−1), (x+1, y−1), (x−1, y), (x+1, y), (x−1, y+1), (x, y+1), and (x+1, y+1), where x is a natural number less than or equal to m, and y is a natural number less than or equal to n.

The number of pixels 10 and the arrangement thereof are not particularly limiting. In FIG. 1, the center of each pixel 10 is located at a grid point of a square grid. The pixels 10 may be arranged so that the center of each pixel 10 is located at a grid point of a triangular grid, a hexagonal grid, or the like. When the pixels 10 are arrayed one-dimensionally, the imaging device 100 can be used as a line sensor.

The imaging apparatus 100A has peripheral circuitry formed at the semiconductor substrate 1.

The peripheral circuitry includes a vertical scanning circuit 52 and a horizontal signal readout circuit 54. The peripheral circuitry can additionally include a control circuit 56 and a voltage supply circuit 58. The peripheral circuitry may further include a signal processing circuit, an output circuit, and so on. These circuits are provided at the semiconductor substrate 1. Part of the peripheral circuitry may be arranged at another substrate different from the semiconductor substrate 1 at which the pixels 10 are formed.

The vertical scanning circuit 52 is also referred to as a "row scanning circuit". Address signal lines 44 are provided corresponding to the rows of the pixels 10 and are connected to the vertical scanning circuit 52. Signal lines provided corresponding to the rows of the pixels 10 are not limited to the address signal lines 44, and a plurality of types of signal line provided for each of the rows of the pixels 10 can be connected to the vertical scanning circuit 52 for the. The horizontal signal readout circuit 54 is also called a column scanning circuit. Vertical signal lines 45 are provided corresponding to the columns of the pixels 10 and are connected to the horizontal signal readout circuit 54.

The control circuit 56 receives command data, a clock signal, and so on given from outside of the imaging apparatus 100A and controls the entire imaging apparatus 100A. Typically, the control circuit 56 has a timing generator and supplies drive signals to the vertical scanning circuit 52, the horizontal signal readout circuit 54, the voltage supply circuit 58, and so on. The control circuit 56 can be implemented by, for example, a microcontroller including one or more processors. Functions of the control circuit 56 may be realized by a combination of a general-purpose processing circuit and software or may be realized by hardware dedicated to processing as described above.

The voltage supply circuit 58 supplies a predetermined voltage to the pixels 10 through a voltage line 48. The voltage supply circuit 58 is not limited to a particular power supply circuit. The voltage supply circuit 58 may be a circuit that converts a voltage, supplied from a power source such as a battery, into the predetermined voltage or may be a circuit that generates the predetermined voltage. The voltage supply circuit 58 may be a portion of the vertical scanning circuit 52. Those circuits included in the peripheral circuitry can be arranged in a peripheral region R2 outside the imaging device 100.

Figure 2:
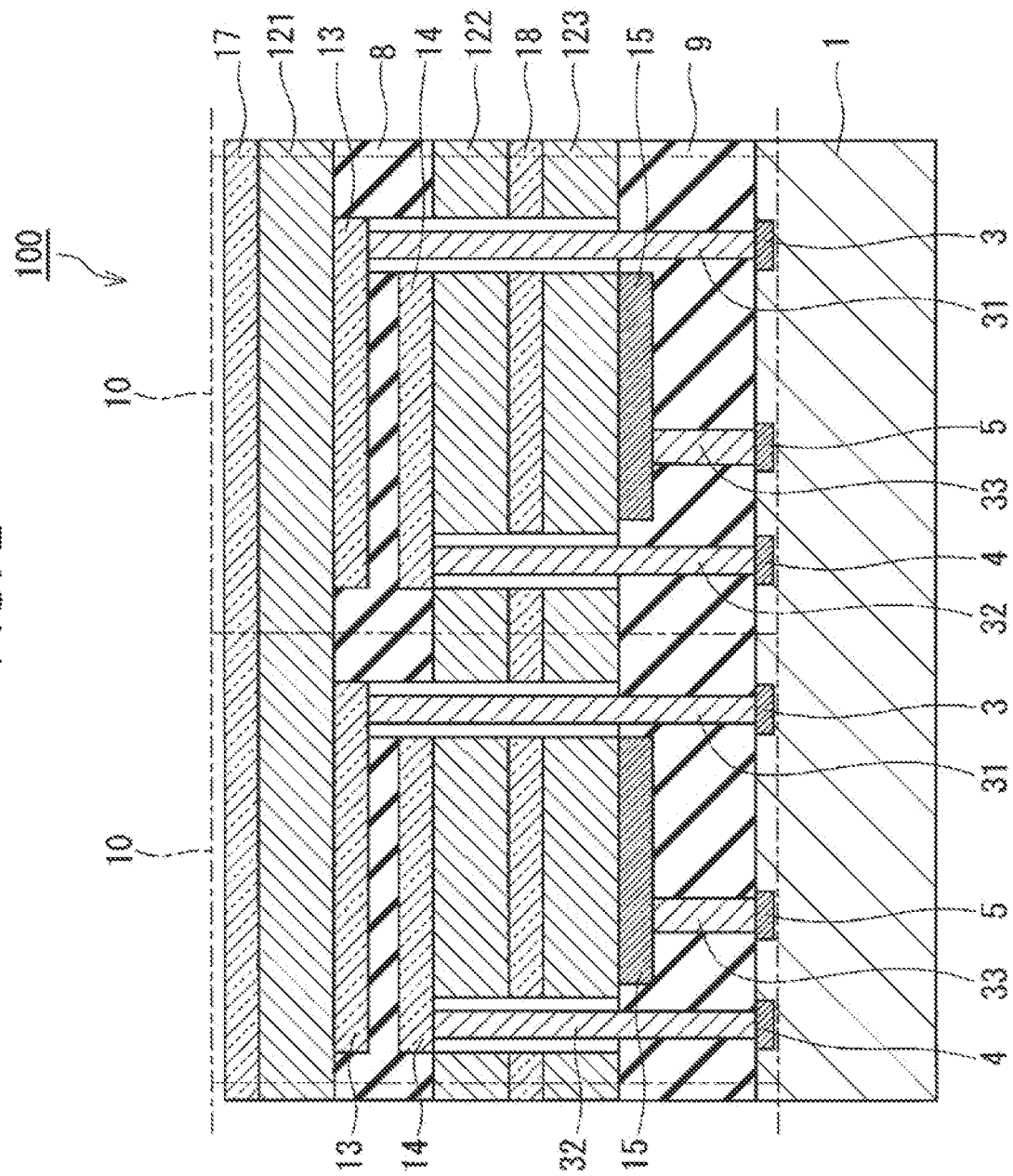
FIG. 2 is a sectional view of the imaging device illustrated in FIG. 1.

FIG. 2 illustrates a cross section of the imaging device 100.

Each pixel 10 has a plurality of photoelectric conversion layers. The photoelectric conversion layers include a first photoelectric conversion layer 121, a second photoelectric conversion layer 122, and a third photoelectric conversion layer 123. The first photoelectric conversion layer 121 may be a single layer shared by two or more pixels 10. The second photoelectric conversion layer 122 may be a single layer shared by two or more pixels 10. The third photoelectric conversion layer 123 may be a single layer shared by two or more pixels 10. However, each of the first photoelectric conversion layer 121, the second photoelectric conversion layer 122, and the third photoelectric conversion layer 123 may be sectioned for each pixel 10. The expression "shared by two or more pixels" means being shared by a particular pixel and at least one pixel adjacent to the particular pixel.

The first photoelectric conversion layer 121, the second photoelectric conversion layer 122, and the third photoelectric conversion layer 123 are made of photoelectric conversion material. The photoelectric conversion material is, typically, organic material.

The first photoelectric conversion layer 121 collects charge (first charge) corresponding to light in a first wavelength range. The second photoelectric conversion layer 122 collects charge (second charge) corresponding to light in a second wavelength range. The third photoelectric conversion layer 123 collects charge (third charge) corresponding to light in a third wavelength range. The first wavelength range is, for example, a wavelength range of blue light. The first photoelectric conversion layer 121 is made of material having sensitivity to blue light. The second wavelength range is, for example, a wavelength range of green light. The second photoelectric conversion layer 122 is made of material having sensitivity to green light. The third wavelength range is, for example, a wavelength range of red light. The third photoelectric conversion layer 123 is made of material having sensitivity to red light.

In the present embodiment, the first photoelectric conversion layer 121, the second photoelectric conversion layer 122, the third photoelectric conversion layer 123, and the semiconductor substrate 1 are arranged in that order. The second photoelectric conversion layer 122 is arranged between the first photoelectric conversion layer 121 and the semiconductor substrate 1 in a normal direction of the semiconductor substrate 1. The third photoelectric conversion layer 123 is arranged between the second photoelectric conversion layer 122 and the semiconductor substrate 1 in the normal direction of the semiconductor substrate 1. The arrangement order of the first photoelectric conversion layer 121, the second photoelectric conversion layer 122, and the third photoelectric conversion layer 123 is not limited to that described above.

Each pixel 10 further includes a plurality of pixel electrodes. The pixel electrodes include a first pixel electrode 13, a second pixel electrode 14, and a third pixel electrode 15. The first pixel electrode 13 is electrically connected to the first photoelectric conversion layer 121. The second pixel electrode 14 is electrically connected to the second photoelectric conversion layer 122. The third pixel electrode 15 is electrically connected to the third photoelectric conversion layer 123.

The first pixel electrode 13 and the second pixel electrode 14 are transparent electrodes that are transmissive to visible light and/or near infrared light. The transparent electrodes are made of transparent conductive oxide, such as indium tin oxide (ITO). The third pixel electrode 15 is a non-transparent electrode that is not transmissive to visible light and/or near infrared light. Examples of material of the non-transparent electrode include metal, metal oxide, metal nitride, and electrically conductive polysilicon.

Herein, "being transmissive" means that the transmittance of light in a particular wavelength range is 40% or more. The wavelength range of visible light is, for example, 400 to 780 nm. The wavelength range of near infrared light is, for example, 780 to 2000 nm. The transmittance can be calculated using a method specified by Japanese Industrial Standard (JIS) R3106 (1998).

An insulating layer 8 is provided between the first pixel electrode 13 and the second pixel electrode 14. An insulating layer 9 is provided between the third pixel electrode 15 and the semiconductor substrate 1. The insulating layers 8 and 9 are made of insulating material, such as silicon dioxide ($SiO_2$).

The pixels 10 further have a plurality of counter electrodes. The counter electrodes include a first counter electrode 17 and a second counter electrode 18. The first counter electrode 17 and the second counter electrode 18 are each shared by two or more pixels 10. Each of the first counter electrode 17 and the second counter electrode 18 is a transparent electrode that is transmissive to visible light and/or near infrared light.

The first counter electrode 17 is provided corresponding to the first pixel electrode 13. The first photoelectric conversion layer 121 is sandwiched between the first counter electrode 17 and the first pixel electrode 13. The second counter electrode 18 is provided corresponding to the second pixel electrode 14 and the third pixel electrode 15. The second photoelectric conversion layer 122 is sandwiched between the second counter electrode 18 and the second pixel electrode 14. The third photoelectric conversion layer 123 is sandwiched between the second counter electrode 18 and the third pixel electrode 15. The first counter electrode 17 is electrically connected to the first photoelectric conversion layer 121. The second counter electrode 18 is electrically connected to the second photoelectric conversion layer 122. The second counter electrode 18 is electrically connected to the third photoelectric conversion layer 123.

In the present embodiment, the second counter electrode 18 applies a voltage to both the second photoelectric conversion layer 122 and the third photoelectric conversion layer 123. The second counter electrode 18, however, may be adapted to apply a voltage to only the second photoelectric conversion layer 122. A third counter electrode may also be provided to apply a voltage to the third photoelectric conversion layer 123.

The pixels 10 may include microlenses. The microlenses can be arranged so as to constitute a surface of the imaging device 100. One microlens or two or more microlenses may be arranged per pixel 10. Each microlens may be arranged so as to concentrate light into a region where the first pixel electrode 13 and the second pixel electrode 14 overlap each other when the imaging device 100 is viewed in plan view.

Each pixel 10 further includes a plurality of plugs. The plugs extend in the normal direction of the semiconductor substrate 1. The plugs include a first plug 31, a second plug 32, and a third plug 33. The first plug 31 provides electrical connection between the semiconductor substrate 1 and the first pixel electrode 13. The second plug 32 provides electrical connection between the semiconductor substrate 1 and the second pixel electrode 14. The third plug 33 provides electrical connection between the semiconductor substrate 1 and the third pixel electrode 15.

The first plug 31, the second plug 32, and the third plug 33 are made of electrically conductive material. Examples of the electrically conductive material include metal, metal oxide, metal nitride, and electrically conductive polysilicon.

The semiconductor substrate 1 has a plurality of charge accumulation regions. The charge accumulation regions may be portions of the pixels 10. Each charge accumulation region is an n-type or p-type impurity region. The charge accumulation regions include a first charge accumulation region 3, a second charge accumulation region 4, and a third charge accumulation region 5. The first plug 31 provides electrical connection between the first charge accumulation region 3 and the first pixel electrode 13. The second plug 32 provides electrical connection between the second charge accumulation region 4 and the second pixel electrode 14. The third plug 33 provides electrical connection between the third charge accumulation region 5 and the third pixel electrode 15.

The semiconductor substrate 1 may have a plurality of transistors for reading out and resetting charge accumulated in the first charge accumulation region 3, the second charge accumulation region 4, and the third charge accumulation region 5.

The pixel electrodes 13, 14, and 15 may be electrically connected to the charge accumulation regions 3, 4, and 5 through plugs that penetrate the semiconductor substrate 1 and wiring layers at a lower side of the semiconductor substrate 1.

Herein, the "upper side" and "lower side" are defined based on the traveling direction of light. The "upper side" is a side that is closer to a light-incidence surface, and the "lower side" is a side that is farther from the light-incidence surface.

When the imaging device 100 is illuminated with light, electron-hole pairs are generated in each of photoelectric conversion layers 121, 122, and 123.

For example, when a voltage is applied between the first counter electrode 17 and the first pixel electrode 13 so that a potential of the first counter electrode 17 exceeds a potential of the first pixel electrode 13, holes, which are positive charge, are gathered at the first pixel electrode 13, and electrons, which are negative charge, are gathered at the first counter electrode 17. The holes gathered at the first pixel electrode 13 are accumulated in the first plug 31 and the first charge accumulation region 3.

When a voltage is applied between the second counter electrode 18 and the second pixel electrode 14 so that a potential of the second counter electrode 18 exceeds a potential of the second pixel electrode 14, holes, which are positive charge, are gathered at the second pixel electrode 14, and electrons, which are negative charge, are gathered at the second counter electrode 18. The holes that are gathered at the second pixel electrode 14 are accumulated in the second plug 32 and the second charge accumulation region 4.

When a voltage is applied between the second counter electrode 18 and the third pixel electrode 15 so that a potential of the second counter electrode 18 exceeds a potential of the third pixel electrode 15, holes, which are positive charge, are gathered at the third pixel electrode 15, and electrons, which are negative charge, are gathered at the second counter electrode 18. The holes that are gathered at the third pixel electrode 15 are accumulated in the third plug 33 and the third charge accumulation region 5.

A blocking layer that prevents flowing of charge into each pixel electrode during dark time may be provided between the pixel electrode and the corresponding photoelectric conversion layer.

The imaging device 100 in the present embodiment has a multi-layer structure. The "multi-layer" means that a plurality of photoelectric conversion layers lies in the normal direction of the semiconductor substrate 1. Since the multi-layer structure makes it possible to ensure a sufficient area of the pixel electrodes, it is advantageous to enhance the sensitivity of the pixels. Since three photoelectric conversion layers lie in the present embodiment, it can be said that the imaging device 100 has a three-layer structure. The first photoelectric conversion layer 121, the second photoelectric conversion layer 122, and the third photoelectric conversion layer 123 typically have photoelectric conversion characteristics that are different from each other.

The following description will be given of an arrangement of the plugs for suppressing crosstalk between the plugs.

Figure 3A:
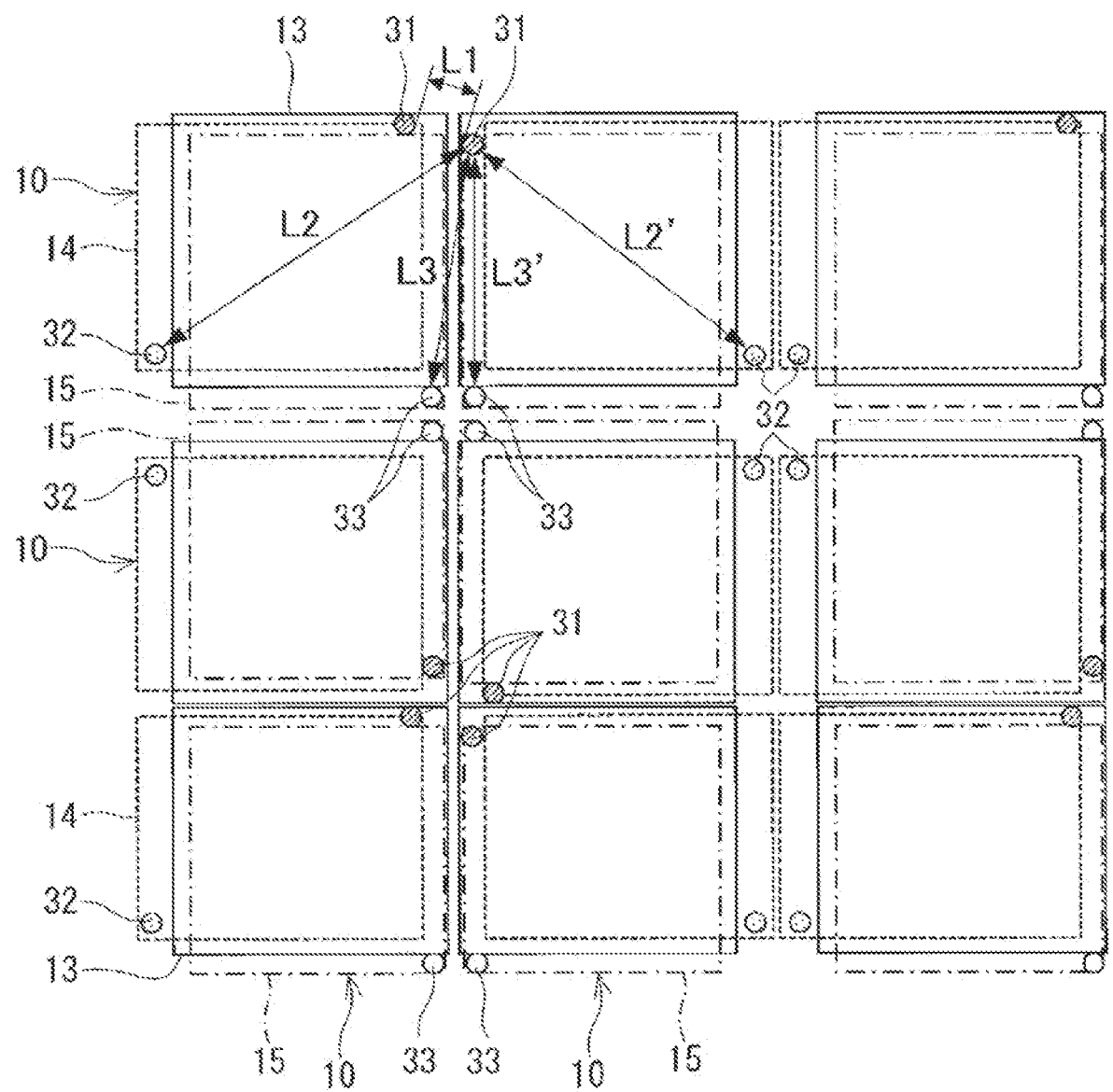
FIG. 3A is a diagram illustrating an arrangement of pixel electrodes and plugs when the imaging device according to the first embodiment is viewed in a normal direction of a semiconductor substrate.

FIG. 3A illustrates an arrangement of the first pixel electrodes 13, the second pixel electrodes 14, the third pixel electrodes 15, the first plugs 31, the second plugs 32, and the third plugs 33 when the imaging device 100 is viewed in the normal direction of the semiconductor substrate 1. In other words, FIG. 3A is a projection view of the first pixel electrodes 13, the second pixel electrodes 14, the third pixel electrodes 15, the first plugs 31, the second plugs 32, and the third plugs 33 projected onto a plane orthogonal to the normal direction of the semiconductor substrate 1. The plugs in an upper layer penetrate the pixel electrodes in a lower layer, as appropriate. Alternatively, the pixel electrodes in the lower layer are notched so as to avoid the plugs in the upper layer, as appropriate.

Herein, viewing the imaging device 100 in the normal direction of the semiconductor substrate 1 is synonymous with viewing the imaging device 100 in plan view.

In the pixels 10 that are adjacent to each other, a distance L1 between the first plugs 31 is smaller than a distance L2 between the first plug 31 and the second plug 32, when the imaging device 100 is viewed in the normal direction of the semiconductor substrate 1. In other words, the distance L2 between the first plug 31 and the second plug 32 is larger than the distance L1 between the first plugs 31. The distances L1 and L2 mean smallest distances L1 and L2, respectively. According to this configuration, it is possible to suppress crosstalk between the plugs corresponding to different colors. This makes it possible to suppress color mixing. It is also possible to sufficiently ensure color sameness between an acquired image and a subject. Specifically, it is possible to suppress color mixing of blue and green. That is, color separation can be enhanced.

Since the first pixel electrodes 13 are the farthest from the semiconductor substrate 1, the first plugs 31 are the longest plugs. Thus, in general, crosstalk between the first plugs 31 and the other plugs is likely to become problematic. According to the present embodiment, since the first plugs 31 are sufficiently away from the other plugs, an advantage of suppressing the crosstalk is sufficiently obtained.

Also, in the pixels 10 that are adjacent to each other, the distance L1 between the first plugs 31 is smaller than a distance L3 between the first plug 31 and the third plug 33. In other words, the distance L3 between the first plug 31 and the third plug 33 is larger than the distance L1 between the first plugs 31. The distance L3 also means a smallest distance L3. According to this configuration, it is possible to suppress color mixing of blue and red, in addition to color mixing of blue and green. That is, color separation can be enhanced.

The distance L1 between the first plugs 31 in the pixels 10 that are adjacent to each other is smaller than a distance L2' between the first plug 31 and the second plug 32 in one particular pixel 10. In other words, the distance L2' between the first plug 31 and the second plug 32 in one particular pixel 10 is larger than the distance L1 between the first plugs 31 in the pixels 10 that are adjacent to each other. The distance L1 between the first plugs 31 in the pixels 10 that are adjacent to each other is smaller than a distance L3' between the first plug 31 and the third plug 33 in one particular pixel 10. The distances L2' and L3' also mean smallest distances L2' and L3', respectively.

According to the present embodiment, in the pixels 10 that are adjacent to each other, the distance between the long plugs is small, and the distance between the long plug and the short plug is large. According to this configuration, the advantage of suppressing crosstalk is high.

Herein, the "distance between plugs" refers to the distance between the center of one plug and the center of another plug. The shape of each plug in plan view is not limited to a circular shape. Thus, the "center of each plug" means the barycenter of the plug.

A wiring layer may be provided between the semiconductor substrate 1 and the third photoelectric conversion layer 123. When the wiring layer is provided, the first plug 31, the second plug 32, and the third plug 33 may be electrically connected to the first charge accumulation region 3, the second charge accumulation region 4, and the third charge accumulation region 5, respectively, via the wiring layer. When the first plug 31, the second plug 32, and the third plug 33 are connected to the first charge accumulation region 3, the second charge accumulation region 4, and the third charge accumulation region 5, respectively, via the wiring layer, the "distance between the plugs" means the distance between portions of the plugs which connect the corresponding pixel electrodes and the wiring layer.

In the imaging device 100 in the present embodiment, eight pixels 10 are adjacent to one particular pixel 10, except for cases in which the particular pixel 10 is located at an outermost periphery of the imaging device 100. This also applies to other embodiments.

In the example illustrated in FIG. 3A, each of the first pixel electrodes 13, the second pixel electrodes 14, and the third pixel electrodes 15 has a rectangular shape. The shape of each of the first pixel electrodes 13, the second pixel electrodes 14, and the third pixel electrodes 15 is typically a square shape. The shape of each pixel electrode is not limited to a rectangular shape. The shape of each pixel electrode may be a polygonal shape other than a rectangular shape, may be a circular shape, or may be a shape obtained by notching a part of a polygonal or circular shape.

Figure 3B:
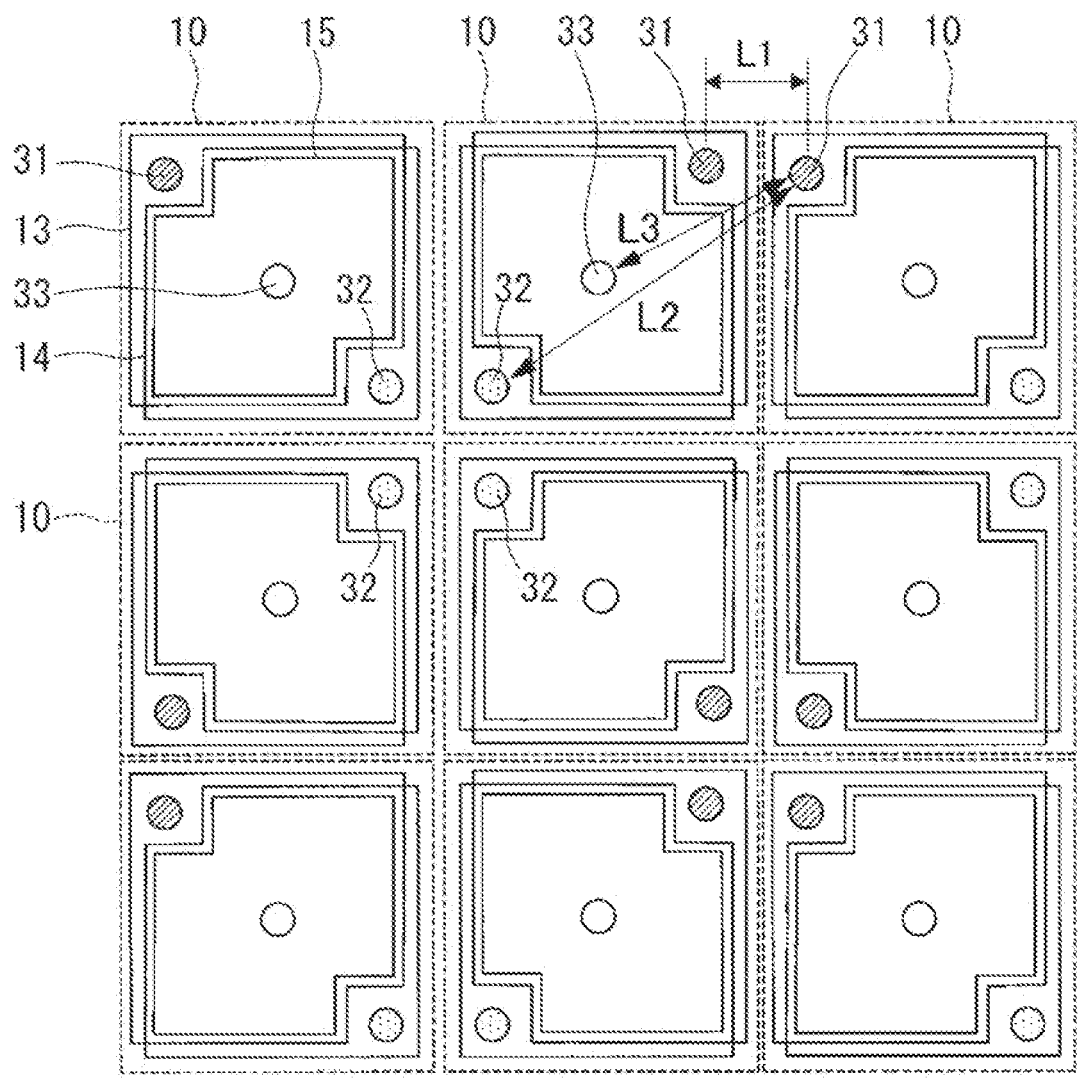
FIG. 3B is a diagram illustrating another arrangement of the pixel electrodes and the plugs.

FIG. 3B illustrates another arrangement of the first pixel electrodes 13, the second pixel electrodes 14, the third pixel electrodes 15, the first plugs 31, the second plugs 32, and the third plugs 33. In the example illustrated in FIG. 3B, in the pixels 10 that are adjacent to each other, the distance L1 between the first plugs 31 is smaller than the distance L2 between the first plug 31 and the second plug 32. Also, in the pixels 10 that are adjacent to each other, the distance L1 between the first plugs 31 is smaller than the distance L3 between the first plug 31 and the third plug 33. Accordingly, the arrangement in FIG. 3B also offers an advantage that is the same as the advantage described above with reference to FIG. 3A.

Figure 3C:
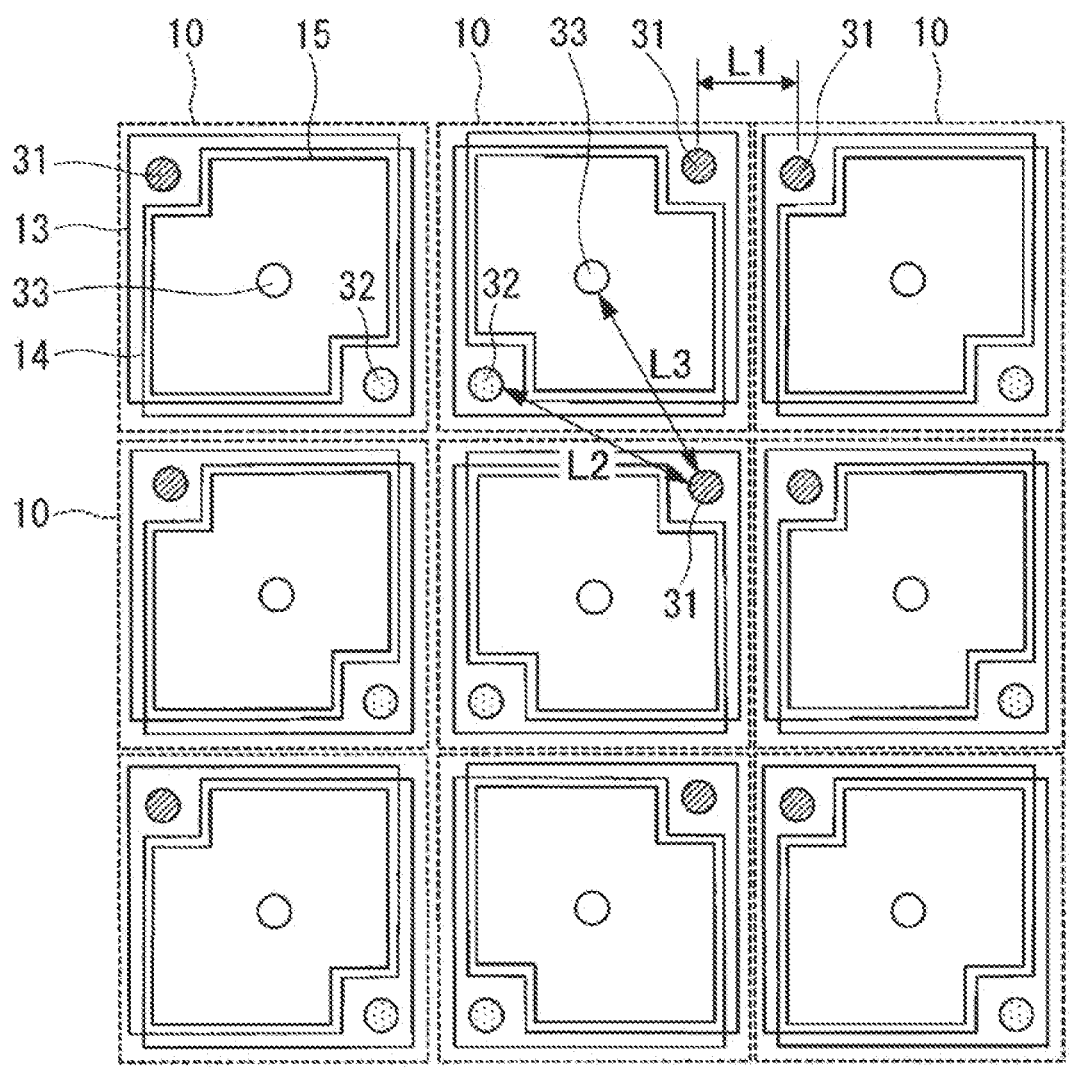
FIG. 3C is a diagram illustrating yet another arrangement of the pixel electrodes and the plugs.

FIG. 3C illustrates another arrangement of the first pixel electrodes 13, the second pixel electrodes 14, the third pixel electrodes 15, the first plugs 31, the second plugs 32, and the third plugs 33. In the example illustrated in FIG. 3C, in the pixels 10 that are adjacent to each other, the distance L1 between the first plugs 31 is smaller than the distance L2 between the first plug 31 and the second plug 32. Also, in the pixels 10 that are adjacent to each other, the distance L1 between the first plugs 31 is smaller than the distance L3 between the first plug 31 and the third plug 33. Accordingly, the arrangement illustrated in FIG. 3C also offers an advantage that is the same as the advantage described above with reference to FIG. 3A.

In the examples illustrated in FIGS. 3B and 3C, the plugs in the upper layer penetrate the pixel electrodes in the lower layer, as appropriate. Alternatively, the pixel electrodes in the lower layer are notched so as to avoid the plugs in the upper layer, as appropriate.

In the examples illustrated in FIGS. 3B and 3C, the first plug 31 and the second plug 32 are arranged at diagonal corners. The first plug 31 and the second plug 32 may be arranged in the vicinity of a diagonal line of the first pixel electrode 13. The first plug 31 and the second plug 32 may also be arranged on a diagonal line of the first pixel electrode 13. According to this arrangement, it is possible to suppress crosstalk in each pixel 10. The "plugs are arranged on a diagonal line of the first pixel electrode 13" means that the plugs overlap a diagonal line of the smallest quadrangular shape surrounding the first pixel electrode 13, when the imaging device 100 is viewed in plan view.

The third photoelectric conversion layer 123 is a photoelectric conversion layer located at the lowest position. Each third plug 33 is shorter than each first plug 31 and is shorter than each second plug 32. Influences of crosstalk between the third plug 33 and the other plugs are small. Hence, the third plugs 33 can be arranged at arbitrary positions. In the present embodiment, each third plug 33 is arranged in a center region of the third pixel electrode 15. According to this configuration, it is possible to ensure sufficient distances between the first charge accumulation region 3, the second charge accumulation region 4, and the third charge accumulation region 5. This makes it possible to suppress crosstalk between the charge accumulation regions and also makes it possible to suppress crosstalk between the charge accumulation region and the corresponding plug. Design freedom of the third charge accumulation regions 5 and transistors connected to the third plugs 33 also improves. The "center region of the pixel electrode" means a region having a certain range including the barycenter of the pixel electrode when the pixel electrode is viewed in plan view. Specifically, when the pixel electrode has a generally rectangular shape in plan view, the pixel electrode is divided into nine rectangular regions so that the areas of the respective divided regions are equal to each other. Of the nine rectangular regions, the region including the barycenter of the pixel electrode is the center region. When the pixel electrode has a notch or the like, the smallest quadrangular shape surrounding the pixel electrode can be divided into nine regions. The barycenter of the pixel electrode can be the barycenter of the smallest quadrangular shape surrounding the pixel electrode.

The third plug 33 may be arranged at a midpoint of a line segment that connects the first plug 31 and the second plug 32. The line segment that connects the first plug 31 and the second plug 32 refers to a line segment that connects the barycenter of the first plug 31 and the barycenter of the second plug 32 when the imaging device 100 is viewed in plan view. The expression "third plug 33 is arranged at a midpoint of the line segment" means that the third plug 33 overlaps the midpoint.

The third plug 33 may be arranged at the center of the third pixel electrode 15. In other words, when the imaging device 100 is viewed in plan view, the center of the third pixel electrode 15 may overlap the third plug 33. The "center of the pixel electrode" can be the barycenter of the pixel electrode when the pixel electrode is viewed in plan view.

Figure 4A:
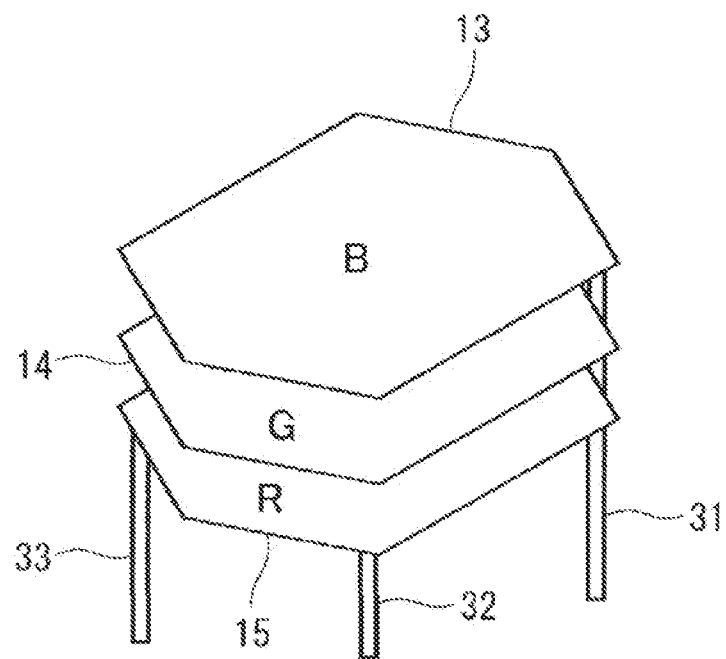
FIG. 4A is a schematic view of another shape of the pixel electrodes.
Figure 4B:
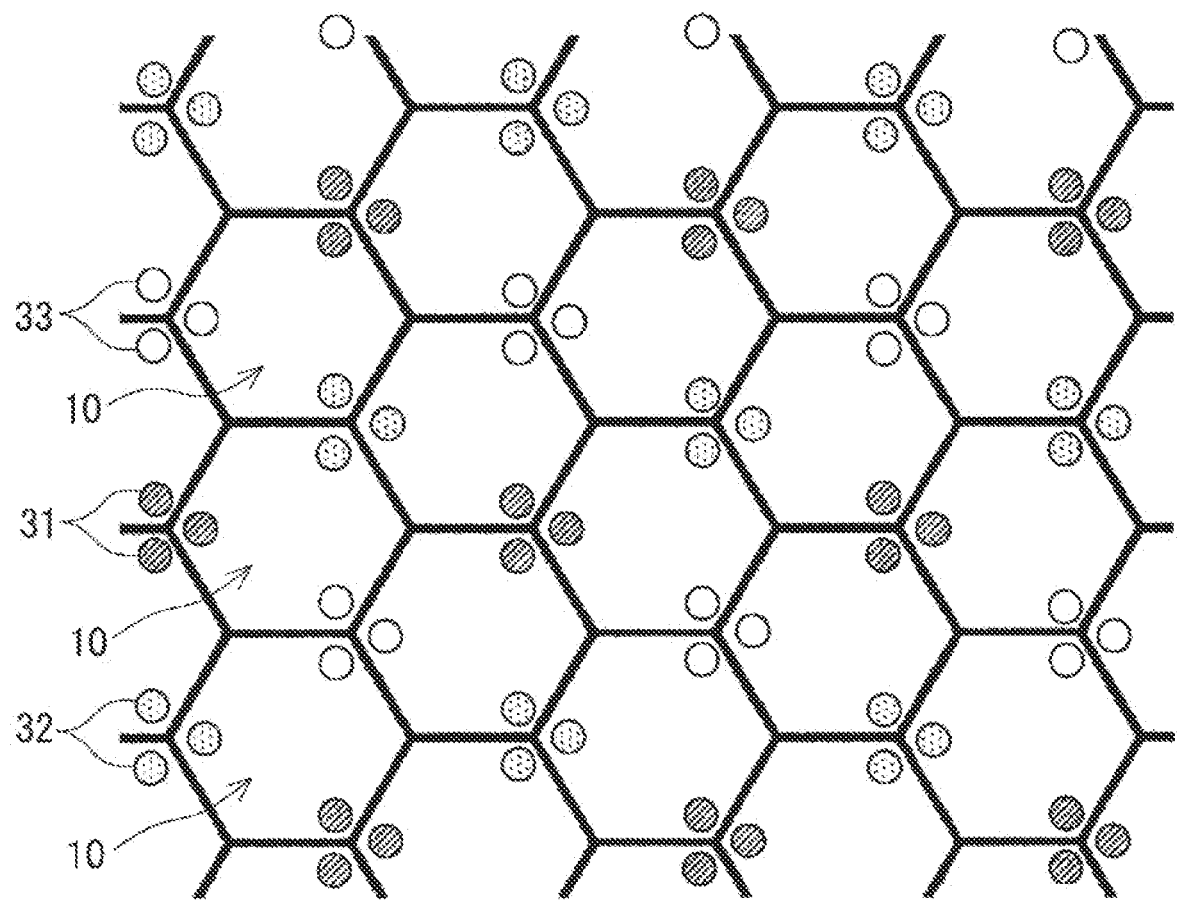
FIG. 4B is a diagram illustrating an arrangement of plugs when each pixel has the pixel electrode illustrated in FIG. 4A.

FIG. 4A illustrates another shape of one first pixel electrode 13, one second pixel electrode 14, and one third pixel electrode 15. FIG. 4B illustrates an arrangement of the first plugs 31, the second plugs 32, and the third plugs 33 when each pixel 10 has the first pixel electrode 13, the second pixel electrode 14, and the third pixel electrode 15 illustrated in FIG. 4A. In the examples illustrated in FIGS. 4A and 4B, each of the first pixel electrodes 13, the second pixel electrodes 14, and the third pixel electrodes 15 has a regular hexagonal shape in plan view. Each of the pixels 10 in the imaging device 100 occupies a regular hexagonal region in plan view. The pixels 10 exhibit a honeycomb structure or a partially cutout honeycomb structure. According to the pixels having a honeycomb structure, it is easy to gather the plugs for the same color. The "plan view" is synonymous with viewing the imaging device 100 in the normal direction of the semiconductor substrate 1. The "partially cutout honeycomb structure" means a structure formed by arranging regular hexagonal shapes that are partially notched.

When the pixels 10 have a honeycomb structure, the number of pixels 10 that are adjacent to one particular pixel 10 is six.

In the present embodiment, the arrangement of the first plugs 31, the second plugs 32, and the third plugs 33 is periodic, and the pixels 10 have translational symmetry. Thus, it is possible to equally reduce crosstalk between the plugs, and it is also possible to reduce variations in crosstalk between the pixels 10.

Some other embodiments will be described below. Elements that are common to both the first embodiment and other embodiments are denoted by the same reference numerals, and descriptions thereof may not be given hereinafter. Descriptions of individual embodiments can be applied to each other, as long as it is not technically contradictory. The embodiments may also be combined together, as long as such a combination is not technically contradictory.

Second Embodiment

FIG. 5 illustrates a cross section of an imaging device 200 according to a second embodiment of the present disclosure. The imaging device 200 has a two-layer structure. In the normal direction of the semiconductor substrate 1, the second photoelectric conversion layer 122 is arranged at the upper side of the first photoelectric conversion layer 121. In other words, the first photoelectric conversion layer 121 is arranged between the second photoelectric conversion layer 122 and the semiconductor substrate 1. The first plug 31 provides electrical connection between the semiconductor substrate 1 and the first pixel electrode 13. The second plug 32 provides electrical connection between the semiconductor substrate 1 and the second pixel electrode 14. According to this configuration, since the first plugs 31 can be made shorter than the second plugs 32, it is possible to suppress crosstalk between the first plugs 31 while suppressing crosstalk between the first plug 31 and the second plug 32.

The first photoelectric conversion layer 121 collects charge corresponding to light in the first wavelength range. The second photoelectric conversion layer 122 collects charge corresponding to light in the second wavelength range. The first wavelength range and the second wavelength range are not limited to particular wavelength ranges. The first wavelength range and the second wavelength range may overlap each other, as long as the center wavelength of the first wavelength range and the center wavelength of the second wavelength range differ from each other. The same applies to the third wavelength range.

The first wavelength range is, for example, a wavelength range of light other than visible light. The first wavelength range is, for example, the wavelength range of near infrared light. The first photoelectric conversion layer 121 can be made of material having sensitivity to near infrared light. The second wavelength range is, for example, the wavelength range of visible light. The second photoelectric conversion layer 122 can be made of material having sensitivity to visible light. According to this configuration, it is possible to suppress mixing of information on visible light and information on near infrared light.

The imaging device 200 further includes a color filter 19. The color filter 19 is arranged at the upper side of the first photoelectric conversion layer 121 and the second photoelectric conversion layer 122. The second photoelectric conversion layer 122 is illuminated with light that passes through the color filter 19. The color filter 19 is, for example, a Bayer filter.

In the present embodiment, each pixel 10 is constituted by a plurality of sub-pixels 10a. The plurality of sub-pixels 10a includes a red sub-pixel 10r, a green sub-pixel 10g, a green sub-pixel 10g, and a blue sub-pixel 10b, which are arranged in two rows by two columns. The red sub-pixel 10r, the green sub-pixel 10g, the green sub-pixel 10g, and the blue sub-pixel 10b are arranged according to a Bayer arrangement.

According to the present embodiment, the first photoelectric conversion layer 121 makes it possible to acquire an image based on near infrared light, while the second photoelectric conversion layer 122 makes it possible to acquire a full-color image.

Figure 6:
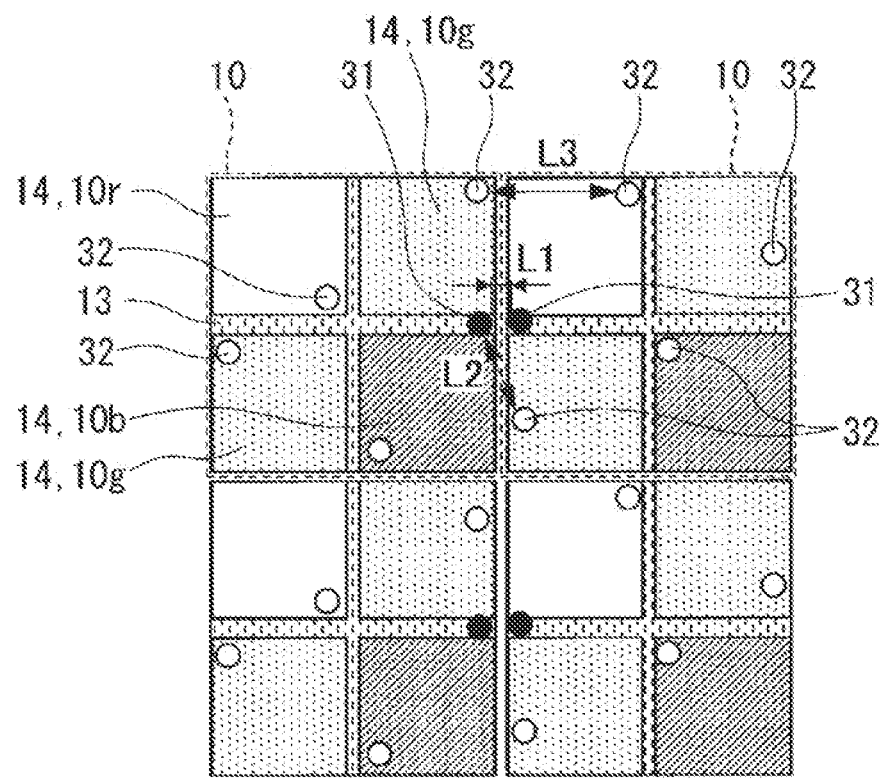
FIG. 6 is a diagram illustrating an arrangement of the pixel electrodes and the plugs when the imaging device according to the second embodiment is viewed in the normal direction of the semiconductor substrate.

FIG. 6 is a diagram illustrating an arrangement of the first pixel electrodes 13, the second pixel electrodes 14, the first plugs 31, and the second plugs 32 when the imaging device 200 is viewed in the normal direction of the semiconductor substrate 1. In other words, FIG. 6 is a projection view of the first pixel electrodes 13, the second pixel electrodes 14, the first plugs 31, and the second plugs 32 projected onto a plane orthogonal to the normal direction of the semiconductor substrate 1.

In the pixels 10 that are adjacent to each other, the distance L1 between the first plugs 31 is smaller than the distance L2 between the first plug 31 and the second plug 32 when the imaging device 200 is viewed in the normal direction of the semiconductor substrate 1. In other words, the distance L2 between the first plug 31 and the second plug 32 is larger than the distance L1 between the first plugs 31.

According to this configuration, it is possible to suppress crosstalk between the plugs corresponding to different colors. Specifically, it is possible to suppress crosstalk between the first plug 31 corresponding to near infrared light and the second plug 32 corresponding to visible light. As a result, it is possible to suppress mixing information on near infrared light and information on visible light. When a color filter is used, the "information on visible light" refers to information on red light, information on green light, and information on blue light, which are information on the three primary colors.

The information on near infrared light is highly likely to be used for a purpose that is different from a purpose of using the information on visible light. Accordingly, when mixing of the information on near infrared light and the information on visible light can be suppressed by suppressing crosstalk between the first plug 31 and the second plug 32, this can be said to be highly beneficial.

In the present embodiment, the first plugs 31 in the pixels 10 that are adjacent to each other are gathered. This is advantageous in terms of ensuring a sufficient distance between the second plugs 32. Signals corresponding to visible light are transmitted to the second plugs 32. Signals corresponding to near infrared light are transmitted to the first plug 31. Compared with an image based on near infrared light, an image based on visible light requires high resolution. Ensuring a sufficient distance between the second plugs 32 meets the requirement.

Specifically, in the pixels 10 that are adjacent to each other, the distance L3 between the second plugs 32 is larger than the distance L1 and is larger than the distance L2. According to this configuration, it is possible to suppress color mixing of red, green, and blue.

Figure 7:
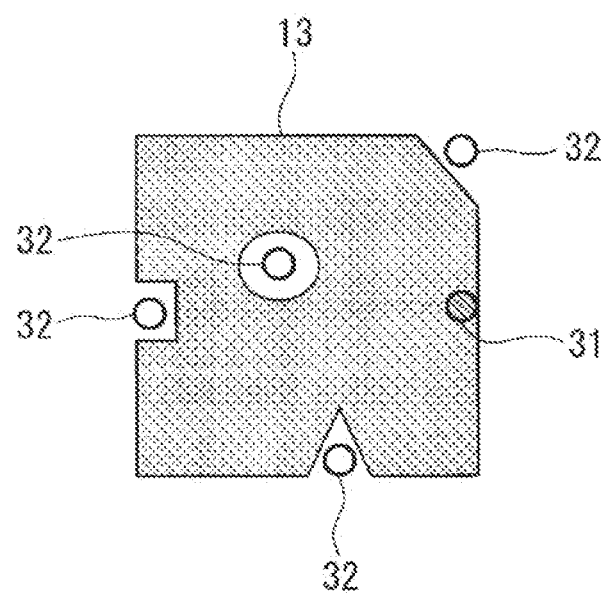
FIG. 7 is a plan view of a first pixel electrode.

FIG. 7 is a plan view of one first pixel electrode 13. As illustrated in FIG. 7, the second plugs 32 extend upward and downward, avoiding the first pixel electrode 13, or pass through penetrating holes provided in the first pixel electrode 13. When the second plug 32 is provided at an outer periphery of the pixel 10, it is possible to ensure a space for the second plug 32 by notching a portion of the first pixel electrode 13 or removing a corner portion of the first pixel electrode 13. When the second plug 32 is provided in the vicinity of the center of the pixel 10, a penetrating holes for passage of the second plug 32 is provided in the first pixel electrode 13.

Third Embodiment

Figure 8:
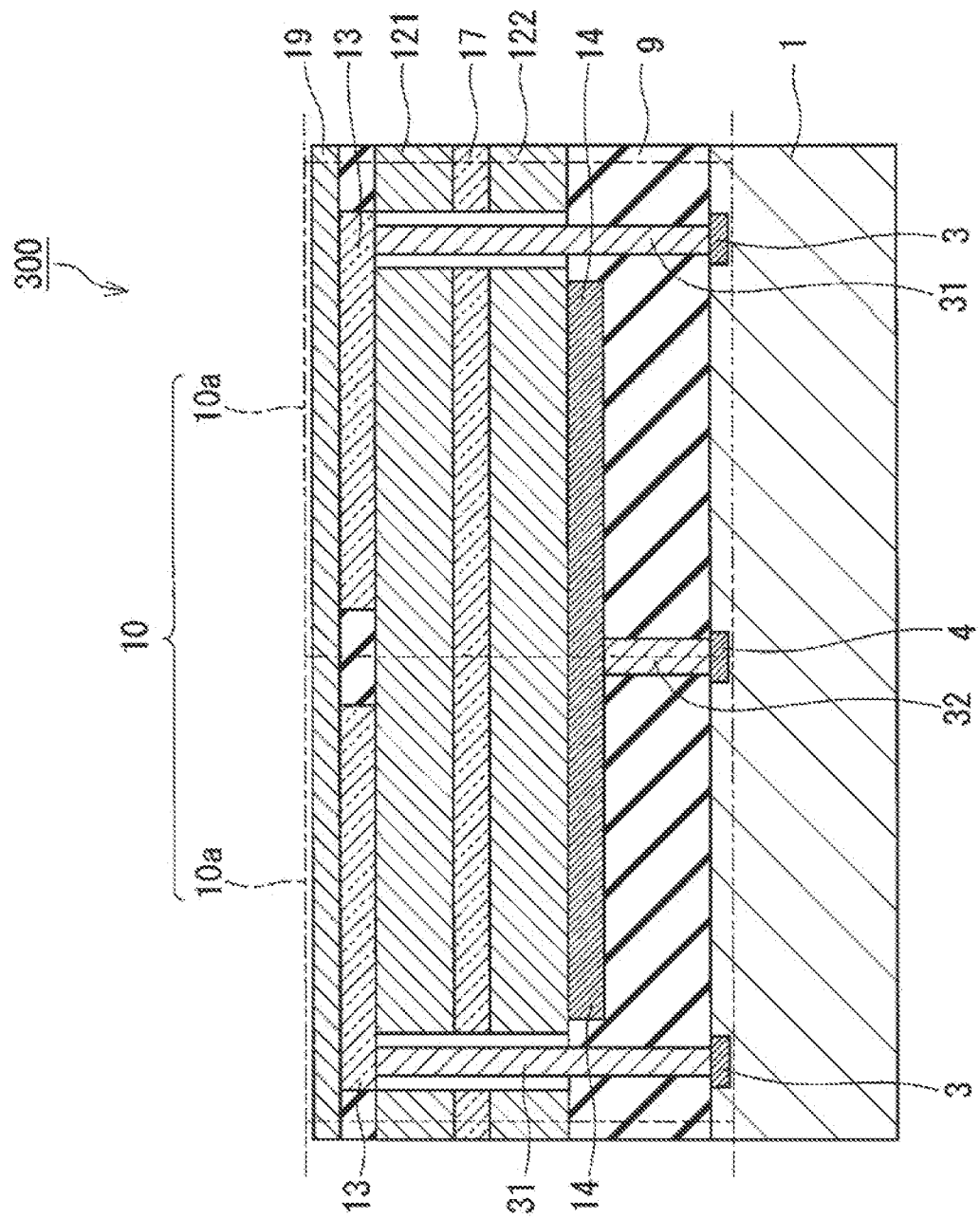
FIG. 8 is a sectional view of an imaging device according to a third embodiment of the present disclosure.

FIG. 8 illustrates a cross section of an imaging device 300 according to a third embodiment of the present disclosure. A difference between the imaging device 300 in the third embodiment and the imaging device 200 in the second embodiment is the arrangement of the plugs.

The second photoelectric conversion layer 122 is arranged between the first photoelectric conversion layer 121 and the semiconductor substrate 1 in the normal direction of the semiconductor substrate 1. In the present embodiment, the first photoelectric conversion layer 121 is a layer for forming an image based on visible light, and the second photoelectric conversion layer 122 is a layer for forming an image based on near infrared light. That is, the configuration in the present embodiment is substantially the same as the configuration in the second embodiment, except that notations are different. The layer for forming an image based on visible light is an upper layer, and the layer for forming an image based on near infrared light is a lower layer. Since this configuration allows the second plugs 32 to be made shorter than the first plugs 31, it is possible to suppress crosstalk between the second plugs 32 while suppressing crosstalk between the first plug 31 and the second plug 32.

The first photoelectric conversion layer 121 collects charge corresponding to light in the first wavelength range. The second photoelectric conversion layer 122 collects charge corresponding to light in the second wavelength range. In the present embodiment, the first wavelength range is the wavelength range of visible light. The second wavelength range is the wavelength range of near infrared light. According to this configuration, it is possible to suppress mixing of information on visible light and information of near infrared light.

Figure 9:
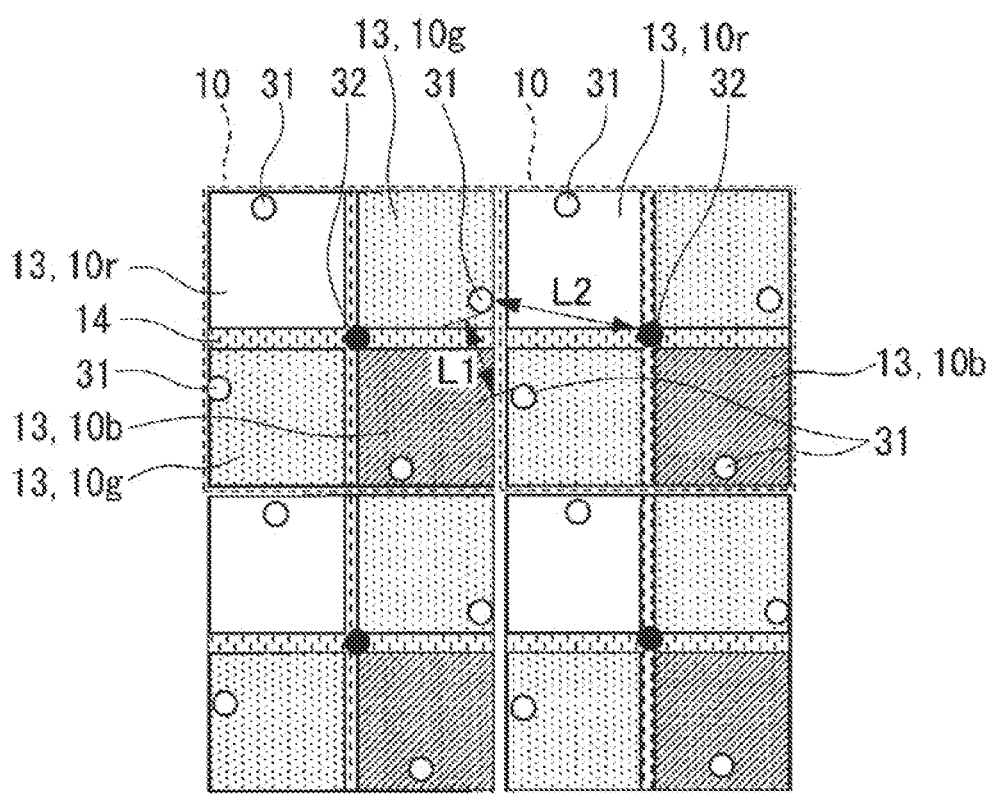
FIG. 9 is a diagram illustrating an arrangement of the pixel electrodes and the plugs when the imaging device according to the third embodiment is viewed in the normal direction of the semiconductor substrate.

FIG. 9 is a diagram illustrating an arrangement of the first pixel electrodes 13, the second pixel electrodes 14, the first plugs 31, and the second plugs 32 when the imaging device 300 is viewed in the normal direction of the semiconductor substrate 1. In other words, FIG. 9 is a projection view of the first pixel electrodes 13, the second pixel electrodes 14, the first plugs 31, and the second plugs 32 projected onto a plane orthogonal to the normal direction of the semiconductor substrate 1.

In the present embodiment, the plurality of sub-pixels 10a also includes the red sub-pixel 10r, the green sub-pixel 10g, the green sub-pixel 10g, and the blue sub-pixel 10b arranged in two rows by two columns. The red sub-pixel 10r, the green sub-pixel 10g, the green sub-pixel 10g, and the blue sub-pixel 10b are arranged according to a Bayer arrangement.

In the pixels 10 that are adjacent to each other, the distance L1 between the first plugs 31 is smaller than the distance L2 between the first plug 31 and the second plug 32 when the imaging device 300 is viewed in the normal direction of the semiconductor substrate 1. Specifically, the distance L1 is a distance between the first plugs 31 in the green sub-pixels 10g that are adjacent to each other. In the pixels 10 that are adjacent to each other, the distance between the first plug 31 in the green sub-pixel 10g and the first plug 31 in the red sub-pixel 10r is larger than the above-described distance L1. Similarly, in the pixels 10 that are adjacent to each other, the distance between the first plug 31 in the green sub-pixel 10g and the first plug 31 in the blue sub-pixel 10b is larger than the above-described first distance L1.

In the present embodiment, it is also possible to suppress crosstalk between the plugs for different colors. Specifically, it is possible to suppress crosstalk between the first plug 31 corresponding to visible light and the second plug 32 corresponding to near infrared light. As a result, it is possible to suppress mixing information on near infrared light and information on visible light.

Figure 10:
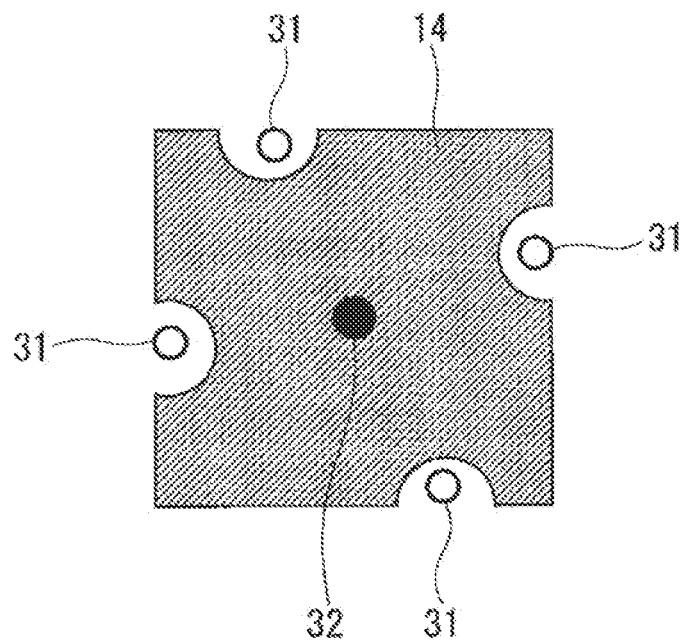
FIG. 10 is a plan view of a second pixel electrode.

FIG. 10 is a plan view of one second pixel electrode 14. As illustrated in FIG. 10, the first plugs 31 extend upward and downward, avoiding the second pixel electrode 14. The second plug 32 is located, for example, in the center region of the pixel 10. According to the present embodiment, the first plugs 31 that extend from the first pixel electrode 13 in the upper layer to the semiconductor substrate 1 do not penetrate the second pixel electrode 14 in the lower layer. The first plugs 31 are arranged around the second pixel electrode 14 in plan view. In other words, when the imaging device 300 is viewed in the normal direction of the semiconductor substrate 1, the first plugs 31 are located outside the range of the second pixel electrode 14. According to this configuration, it is possible to reduce variations in the thickness of the second photoelectric conversion layer 122, surface roughness of the second photoelectric conversion layer 122, and so on. As a result, an image quality due to the second photoelectric conversion layer 122 improves.

Figure 11:
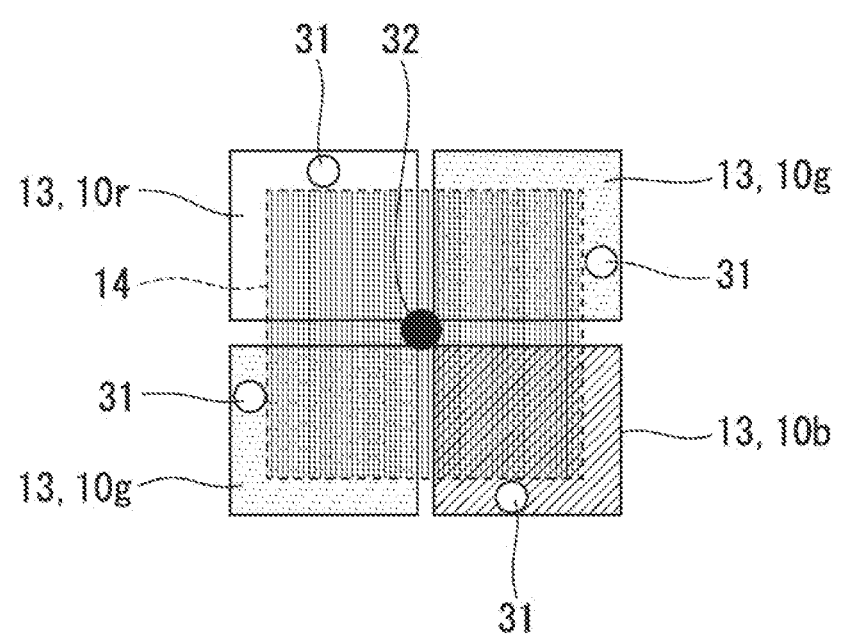
FIG. 11 is a plan view illustrating another positional relationship of the second pixel electrode, the first pixel electrodes, and first plugs.

FIG. 11 is a plan view illustrating another positional relationship of the second pixel electrode 14, the first pixel electrodes 13, and the first plugs 31. In the example illustrated in FIG. 11, the area of the second pixel electrode 14 in the lower layer is smaller than the total area of four first pixel electrodes 13 in the upper layer. Specifically, the smallest quadrangular area surrounding four first pixel electrodes 13 is larger than the area of the second pixel electrode 14. According to this configuration, since the second pixel electrode 14 can be formed avoiding the first plugs 31, it is possible to further reduce variations in the thickness of the second photoelectric conversion layer 122, which is a photoelectric conversion layer in the lower layer, surface roughness of the second photoelectric conversion layer 122, and so on. The areas and the shapes of the first pixel electrodes 13 may be the same among the red sub-pixel 10r, the green sub-pixel 10g, the green sub-pixel 10g, and the blue sub-pixel 10b or may be different from one another among the red sub-pixel 10r, the green sub-pixel 10g, the green sub-pixel 10g, and the blue sub-pixel 10b.

First Modification

Figure 12A:
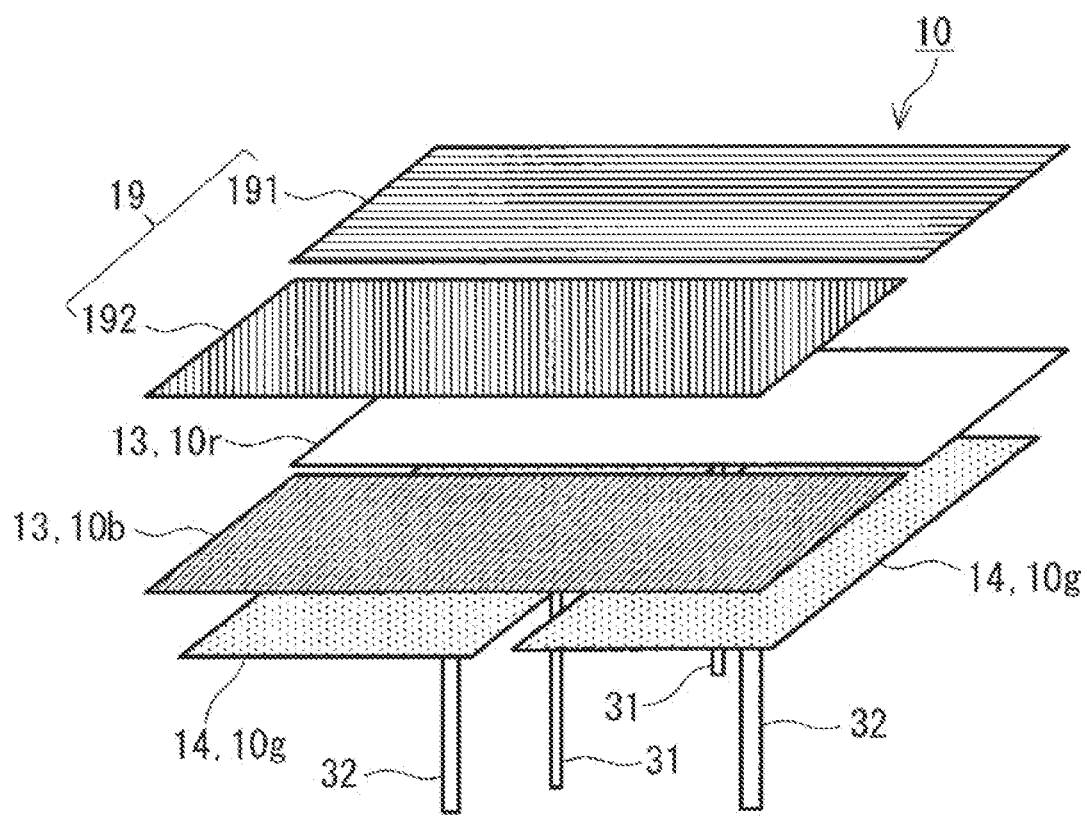
FIG. 12A is a schematic view illustrating another structure of each pixel in the imaging device having a two-layer structure.

FIG. 12A illustrates another structure of each pixel 10 in the imaging device 300 having a two-layer structure. In this modification, the first photoelectric conversion layer 121 (FIG. 8) in the upper layer has sensitivity to the wavelength range of red light and the wavelength range of blue light. The second photoelectric conversion layer 122 (FIG. 8) in the lower layer has sensitivity to the wavelength range of green light. That is, the first wavelength range includes the wavelength range of red light and the wavelength range of blue light. The second wavelength range includes the wavelength range of green light. The first photoelectric conversion layer 121 can be fabricated using a mixed material of photoelectric conversion material having sensitivity to the wavelength range of red light and photoelectric conversion material having sensitivity to the wavelength range of blue light. The mixed material includes, for example, a fullerene dielectric and phthalocyanine. The second photoelectric conversion layer 122 can be fabricated using photoelectric conversion material having sensitivity to the wavelength range of green light. The red sub-pixel 10r can occupy an area that is equal to half the area of one pixel 10. The blue sub-pixel 10b can occupy an area that is equal to half the area of one pixel 10. Each green sub-pixel 10g can occupy an area that is equal to half the area of one pixel 10. Two green sub-pixels 10g are provided in one pixel 10. According to this configuration, it is possible to increase the area of the green sub-pixels 10g having a high luminosity factor, while ensuring an advantage of the multi-layer structure. Thus, according to this modification, it is possible to acquire an image with sensitivity that is comparable to that of an imaging device having a Bayer arrangement. The colors of the respective pixels can be determined in image processing that is similar to image processing in an imaging device employing a Bayer arrangement.

Specifically, in the square region of each pixel 10, the first pixel electrode 13 included in the red sub-pixel 10r has a rectangular shape. The first pixel electrode 13 included in the blue sub-pixel 10b has a rectangular shape. The second pixel electrode 14 included in each green sub-pixel 10g also has a rectangular shape. The longitudinal direction of each first pixel electrode 13 is orthogonal to the longitudinal direction of each second pixel electrode 14. However, the shapes of the first pixel electrode 13 and the second pixel electrode 14 are not particularly limiting.

The color filter 19 includes a color filter 191 for cutting blue light and a color filter 192 for cutting red light. The first pixel electrode 13 included in the red sub-pixel 10r is covered by the color filter 191 for cutting blue light. The first photoelectric conversion layer 121 included in the red sub-pixel 10r has sensitivity to red light. The first pixel electrode 13 included in the blue sub-pixel 10b is covered by the color filter 192 for cutting red light. The first photoelectric conversion layer 121 included in the blue sub-pixel 10b has sensitivity to blue light. Green light passes through the color filter 19 and the first photoelectric conversion layer 121 and is absorbed by the second photoelectric conversion layer 122. The second photoelectric conversion layer 122 included in the green sub-pixel 10g has sensitivity to green light. The color filters 191 and 192 reliably separate red light, green light, and blue light. A R signal, a G signal, and a B signal are taken out from the red sub-pixel 10r, the green sub-pixel 10g, and the blue sub-pixel 10b, respectively. According to this modification, while ensuring the advantage of the multi-layer structure, it is possible to acquire an image having sensitivity that is comparable to that of an imaging device having a Bayer arrangement. According to this modification, the imaging device can be given sensitivity to the wavelength range of blue light, the wavelength range of red light, and the wavelength range of green light. This makes it possible to acquire full-color images. In addition, the colors of the respective pixels can be determined in image processing that is similar to image processing in the imaging device employing a Bayer arrangement.

Figure 12B:
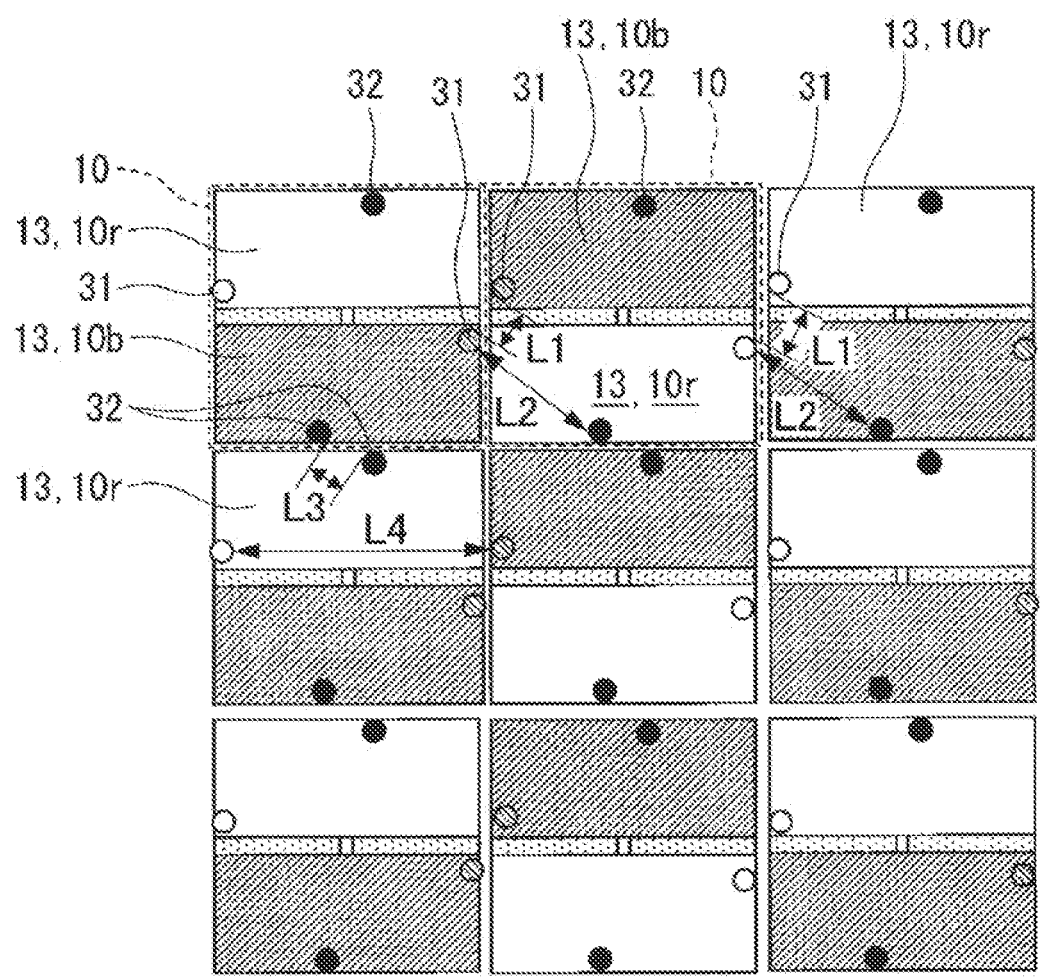
FIG. 12B is a diagram illustrating an arrangement of the plugs when each pixel has the structure illustrated in FIG. 12A.

FIG. 12B illustrates an arrangement of the first plugs 31 and the second plugs 32 when each pixel 10 has the structure illustrated in FIG. 12A. In the pixels 10 that are adjacent to each other, the distance L1 between the first plugs 31 is smaller than the distance L2 between the first plug 31 and the second plug 32. Specifically, in the pixels 10 that are adjacent to each other, the distance L1 between the first plug 31 in one blue sub-pixel 10b and the first plug 31 in another blue sub-pixel 10b is equal to the distance L1 between the first plug 31 in one red sub-pixel 10r and the first plug 31 in another red sub-pixel 10r. In the pixels 10 that are adjacent to each other, the distance L3 between the second plug 32 in one green sub-pixel 10g and the second plug 32 in another green sub-pixel 10g is, for example, equal to the distance L1. In the pixels 10 that are adjacent to each other, a distance L4 between the first plug 31 in the blue sub-pixel 10b and the first plug 31 in the red sub-pixel 10r is generally equal to the length of a long side of the first pixel electrode 13. The distance L4 also means a smallest distance L4. The distance L4 is larger than the distance L1. That is, in the pixels 10 that are adjacent to each other, the first plugs 31 in two red sub-pixels 10r are paired with each other. The second plugs 32 in two green sub-pixels 10g are paired with each other. The first plugs 31 in two blue sub-pixels 10b are paired with each other. The distances between the plugs in the sub-pixels for different colors are the distances L2 and L4 and are sufficiently larger than the distances L1 and L3.

Accordingly, in this modification, it is also possible to suppress crosstalk between the plugs corresponding to different colors. This makes it possible to suppress color mixing. It is also possible to sufficiently ensure color sameness between an acquired image and a subject.

According to the present embodiment, the first photoelectric conversion layer 121 in the upper layer has sensitivity to the wavelength range of red light and the wavelength range of blue light, and the second photoelectric conversion layer 122 in the lower layer has sensitivity to the wavelength range of green light. The second plug 32 in the green sub-pixel 10g is shorter than the first plug 31 in the red sub-pixel 10r and the first plug 31 in the blue sub-pixel 10b. Thus, the second plug 32 in the green sub-pixel 10g is less vulnerable to influences of crosstalk. This makes it possible to suppress color mixing of green having a high luminosity factor and other colors. This is significantly beneficial in improving the image quality.

The first photoelectric conversion layer 121 in the upper layer may also provide the green sub-pixel 10g. The second photoelectric conversion layer 122 in the lower layer may be included in the red sub-pixel 10r and the blue sub-pixel 10b. In this case, the color filter 19 may be arranged between the first photoelectric conversion layer 121 and the second photoelectric conversion layer 122 in the normal direction of the semiconductor substrate 1.

Second Modification

Figure 13A:
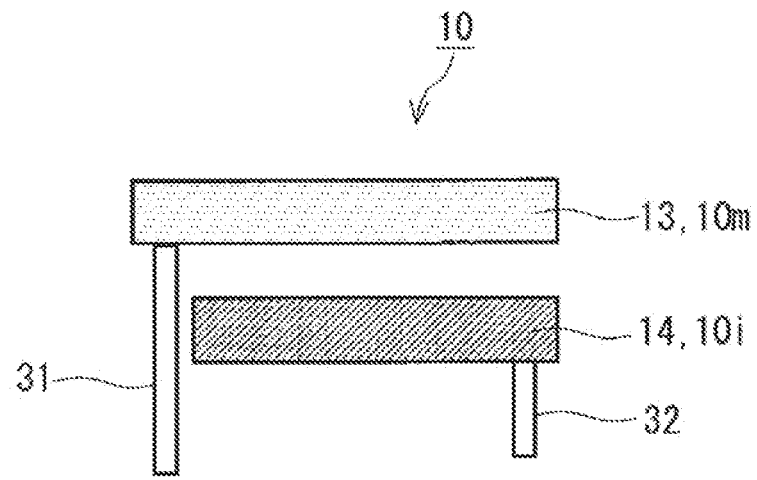
FIG. 13A is a diagram illustrating yet another structure of each pixel in the imaging device having the two-layer structure.

FIG. 13A illustrates yet another structure of each pixel 10 in the imaging device 300 having the two-layer structure. In this modification, the pixel 10 has a sub-pixel 10m including the first pixel electrode 13 and a sub-pixel 10i including the second pixel electrode 14. The sub-pixel 10m is a pixel for forming an image based on grayscale light (i.e., only lightness). The sub-pixel 10i is a pixel for forming an image based on near infrared light.

The sub-pixel 10m includes the first photoelectric conversion layer 121 in the upper layer and the first pixel electrode 13 (FIG. 8). The sub-pixel 10i includes the second photoelectric conversion layer 122 in the lower layer and the second pixel electrode 14 (FIG. 8). The first photoelectric conversion layer 121 in the upper layer has sensitivity to the wavelength range of visible light. The second photoelectric conversion layer 122 in the lower layer has sensitivity to the wavelength range of near infrared light. That is, the first wavelength range includes the wavelength range of visible light. The second wavelength range includes the wavelength range of near infrared light. The first photoelectric conversion layer 121 can be created using photoelectric conversion material having sensitivity to the wavelength range of visible light. The second photoelectric conversion layer 122 can be created using photoelectric conversion material having sensitivity to the wavelength range of near infrared light.

Figure 13B:
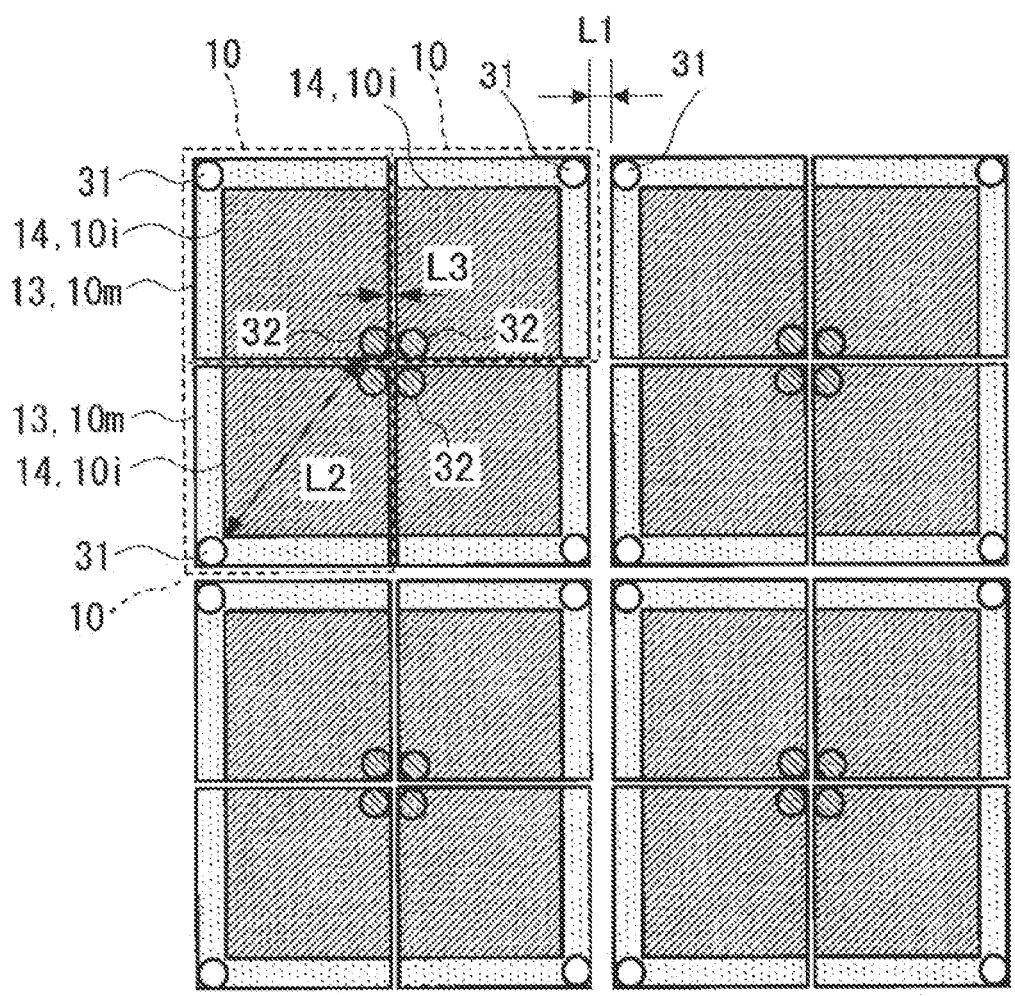
FIG. 13B is a diagram illustrating an arrangement of the plugs when each pixel has the structure illustrated in FIG. 13A.

FIG. 13B illustrates an arrangement of the first plugs 31 and the second plugs 32 when each pixel 10 has the structure illustrated in FIG. 13A. In the pixels 10 that are adjacent to each other, the distance L1 between the first plugs 31 is smaller than the distance L2 between the first plug 31 and the second plug 32. Accordingly, in this modification, it is possible to suppress crosstalk between the plugs corresponding to grayscale and near-infrared that are different colors. This makes it possible to suppress color mixing. It is also possible to sufficiently ensure color sameness between an acquired image and a subject.

The pixels 10 that are adjacent to each other and to which the paired first plugs 31 that indicate the distance L1 belongs may be different from the pixels 10 that are adjacent to each other and to which the first plug 31 and the second plug 32 that indicate the distance L2 belong.

In the pixels 10 that are adjacent to each other, the distance L3 between the second plugs 32 may be equal to, smaller than, or larger than the distance L1 between the first plugs 31. The position of the first photoelectric conversion layer 121 may be interchanged with the position of the second photoelectric conversion layer 122. That is, the upper layer may be a layer having sensitivity to near infrared light, and the lower layer may be a layer having sensitivity to visible light. The upper layer can be a layer having sensitivity to ultraviolet light, near infrared light, red light, green light, blue light, or visible light, and the lower layer can be a layer having sensitivity to light in a wavelength range that is different from the wavelength range of the upper layer.

Fourth Embodiment

Figure 14A:
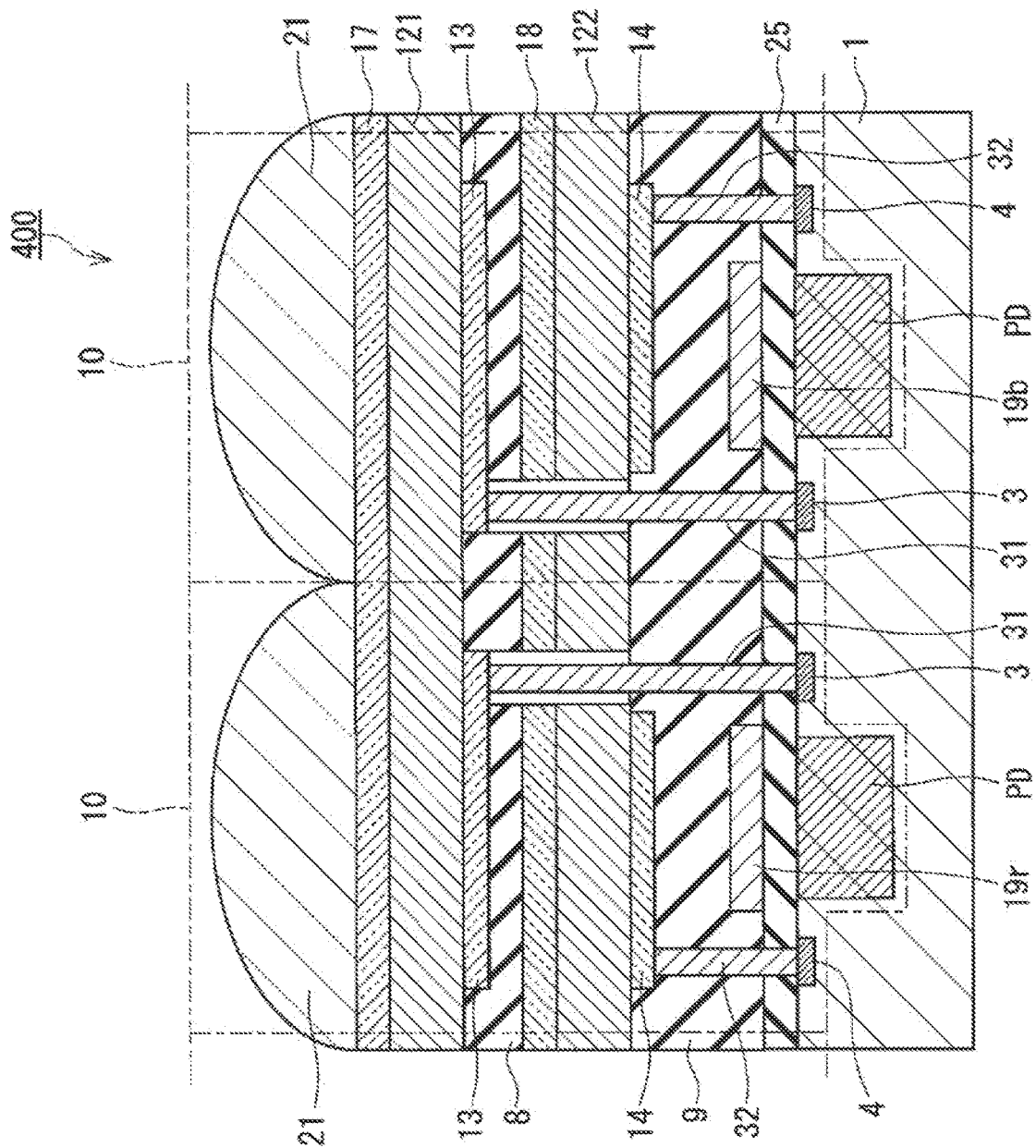
FIG. 14A is a sectional view of an imaging device according to a fourth embodiment of the present disclosure.

FIG. 14A illustrates a cross section of an imaging device 400 according to a fourth embodiment. The imaging device 400 also has a two-layer structure. Each pixel 10 in the imaging device 400 further includes a photodiode PD instead of the third photoelectric conversion layer 123, the third pixel electrode 15, the third plug 33, and the third charge accumulation region 5 in the imaging device 100 described above with reference to FIG. 2.

The photodiode PD is provided at the semiconductor substrate 1. Each of the first pixel electrode 13 and the second pixel electrode 14 is light transmissive. A color filter 19r or a color filter 19b is provided between the photodiode PD and the second photoelectric conversion layer 122. Each of the photodiodes PD is covered by the color filter 19r or the color filter 19b. An insulating layer 25 is provided between the photodiode PD and the color filters 19r and 19b. The insulating layer 25 is made of insulating material, such as $SiO_2$. The insulating layer 9 lies between the second pixel electrode 14 and the color filters 19r and 19b. The insulating layer 9 serves as a planarization layer and can be made of a transparent resin, such as acrylic resin or epoxy resin. The imaging device 400 includes condensing lenses 21. Owing to the functions of the condensing lens 21, light can be effectively introduced into the photodiodes PD. The condensing lenses have functions that are similar to those of the above-described microlens.

The first photoelectric conversion layer 121 has sensitivity to, for example, the wavelength range of near infrared light. The first photoelectric conversion layer 121 can be created using photoelectric conversion material having sensitivity to the wavelength range of near infrared light. The second photoelectric conversion layer 122 has sensitivity to, for example, the wavelength range of green light. The second photoelectric conversion layer 122 can be created using photoelectric conversion material having sensitivity to the wavelength range of green light. The photodiode PD is, typically, a silicon photodiode. The color filter 19r is a filter for cutting red light. The color filter 19b is filter for cutting blue light.

Since the first photoelectric conversion layer 121 has sensitivity to the wavelength range of near infrared light, and the second photoelectric conversion layer 122 has sensitivity to the wavelength range of green light, red light and blue light reach the color filters 19r and 19b. Red light is cut by the color filter 19r, and only blue light is incident on the corresponding photodiode PD. Blue light is cut by the color filter 19b, and only red light is incident on the corresponding photodiode PD. Accordingly, the imaging device 400 can form near-infrared-light-based images and full-color images.

Figure 14B:
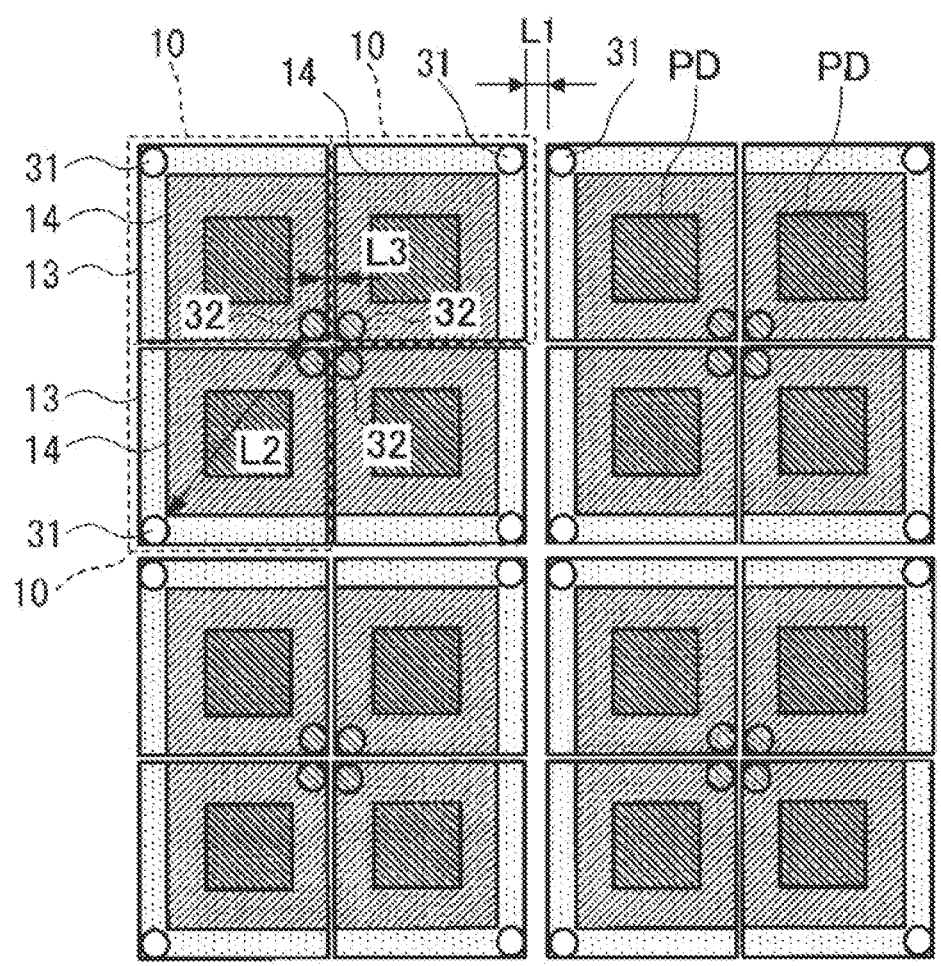
FIG. 14B is a diagram illustrating an arrangement of the pixel electrodes, the plugs, and photodiodes when the imaging device according to the fourth embodiment is viewed in the normal direction of the semiconductor substrate.

FIG. 14B illustrates an arrangement of the first pixel electrodes 13, the second pixel electrodes 14, the first plugs 31, the second plugs 32, and the photodiodes PD when the imaging device 400 is viewed in the normal direction of the semiconductor substrate 1. The first plugs 31 and the second plugs 32 in the imaging device 400 in the present embodiment employ, for example, an arrangement that is substantially the same as the arrangement of the first plugs 31 and the second plugs 32 described above with reference to FIG. 13B. That is, in the pixels 10 that are adjacent to each other, the distance L1 between the first plugs 31 is smaller than the distance L2 between the first plug 31 and the second plug 32. Accordingly, in this modification, it is also possible to suppress crosstalk between the plugs corresponding to near infrared light and green light that are light of different colors. This makes it possible to suppress color mixing. It is also possible to sufficiently ensure color sameness between an acquired image and a subject.

The pixels 10 that are adjacent to each other and to which the paired first plugs 31 that indicate the distance L1 belongs may be different from the pixels 10 that are adjacent to each other and to which the first plug 31 and the second plug 32 that indicate the distance L2 belong.

In the pixels 10 that are adjacent to each other, the distance L3 between the second plugs 32 may be equal to, smaller than, or larger than the distance L1 between the first plugs 31. The position of the first photoelectric conversion layer 121 may be interchanged with the position of the second photoelectric conversion layer 122. That is, the upper layer may be a layer having sensitivity to green light, and the lower layer may be a layer having sensitivity to near infrared light.

Fifth Embodiment

Figure 15A:
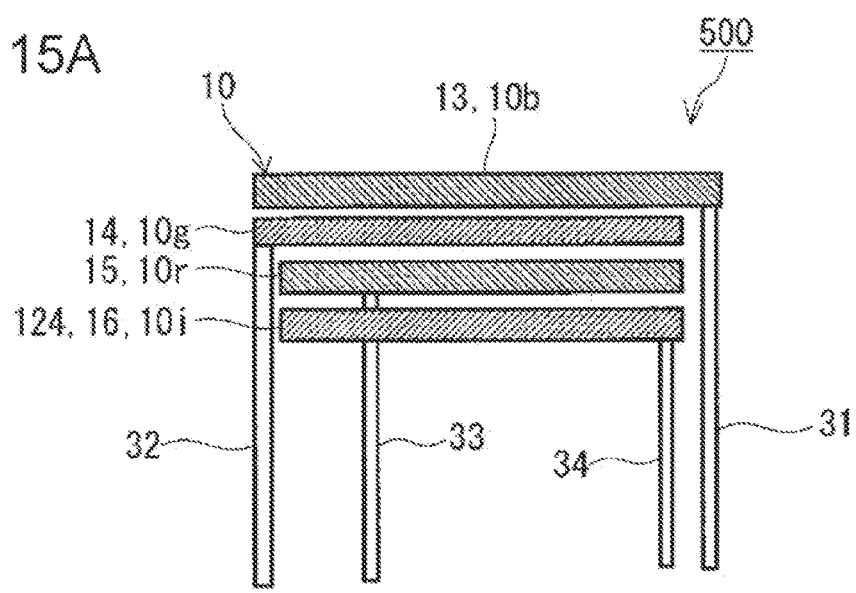
FIG. 15A is a diagram illustrating an imaging device according to a fifth embodiment of the present disclosure.

FIG. 15A illustrates a configuration of an imaging device 500 according to a fifth embodiment of the present disclosure. The imaging device 500 has a four-layer structure. The imaging device 500 includes a fourth photoelectric conversion layer 124, fourth pixel electrodes 16, and fourth plugs 34, in addition to the configuration of the imaging device 100 in the first embodiment. That is, each pixel 10 in the imaging device 500 includes the sub-pixel 10i. The fourth pixel electrodes 16 are included in the sub-pixels 10i.

The fourth photoelectric conversion layer 124 is arranged, for example, between the third photoelectric conversion layer 123 and the semiconductor substrate 1 in the normal direction of the semiconductor substrate 1. Each fourth pixel electrode 16 is electrically connected to the fourth photoelectric conversion layer 124 to collect charge corresponding to light in a fourth wavelength range. The fourth wavelength range is, for example, the wavelength range of near infrared light. The fourth photoelectric conversion layer 124 is made of material having sensitivity to near infrared light. Each fourth plug 34 provides electrical connection between the semiconductor substrate 1 and the corresponding fourth pixel electrode 16.

Visible light is absorbed by the first photoelectric conversion layer 121, the second photoelectric conversion layer 122, and the third photoelectric conversion layer 123 in the upper layers. Since visible light does not reach the fourth photoelectric conversion layer 124 having sensitivity to near infrared light, the sub-pixel 10i having sensitivity to only near infrared light can be formed. The sub-pixels 10i make it possible to acquire near-infrared light-based images.

Figure 15B:
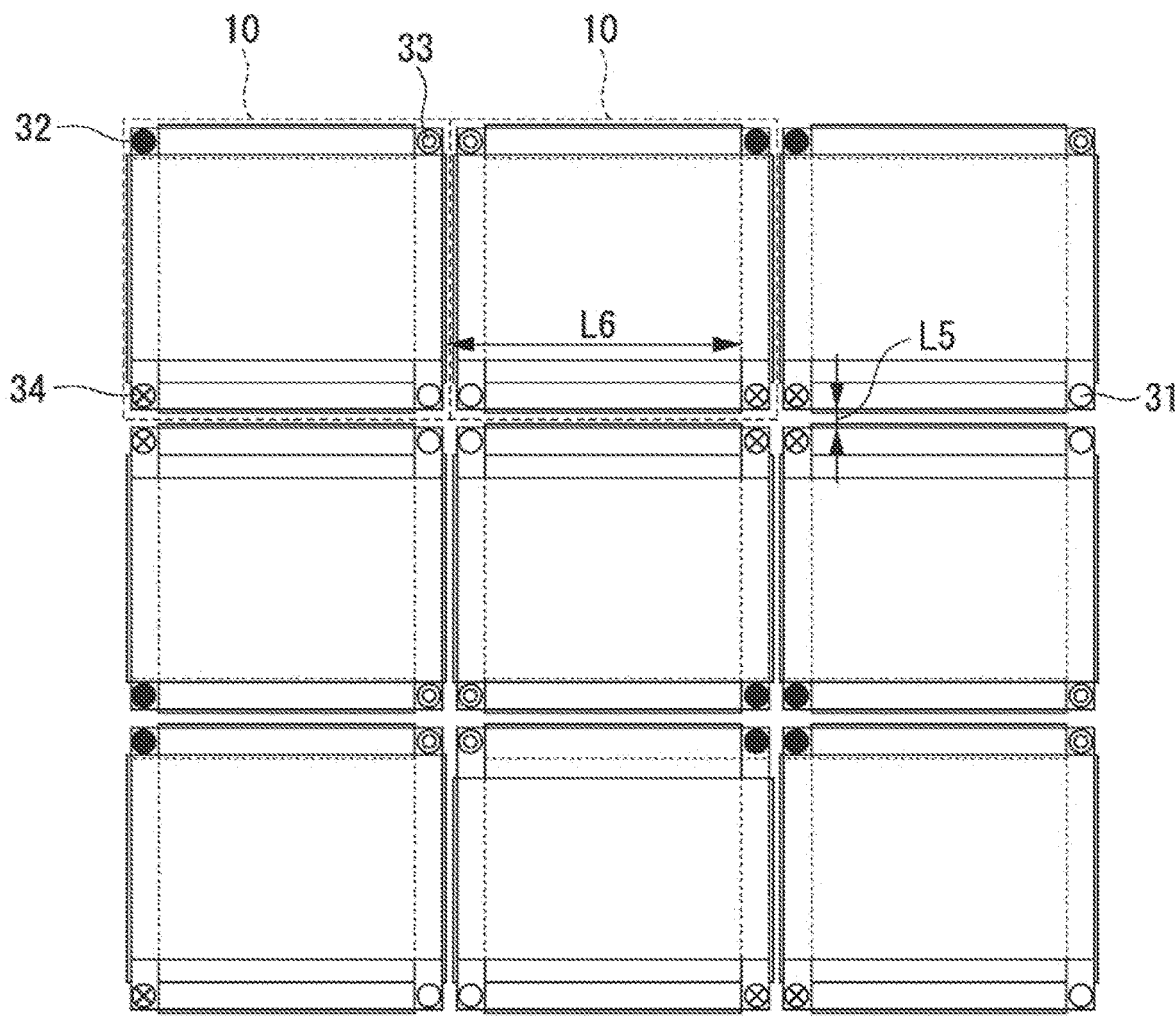
FIG. 15B is a diagram illustrating an arrangement of the plugs when each pixel has the structure illustrated in FIG. 15A.

FIG. 15B illustrates an arrangement of the first plugs 31, the second plugs 32, the third plugs 33, and the fourth plugs 34 when each pixel 10 has the structure illustrated in FIG. 15A. In FIG. 15B, the individual plugs are denoted by four different symbols.

In the pixels 10 that are adjacent to each other, a distance L5 between one fourth plug 34 and another fourth plug 34 is smaller than a distance L6 between one fourth plug 34 and one first plug 31. Accordingly, in this modification, it is also possible to suppress crosstalk between the plugs corresponding to different colors. Similarly, in the pixels 10 that are adjacent to each other, the distance L5 between one fourth plug 34 and another fourth plug 34 is smaller than the distance between the fourth plug 34 and the second plug 32 and is smaller than the distance between the fourth plug 34 and the third plug 33. This makes it possible to suppress color mixing.

In the present embodiment, a photoelectric conversion layer having sensitivity to near infrared light is the fourth photoelectric conversion layer 124, and a photoelectric conversion layer having sensitivity to blue light is the first photoelectric conversion layer 121. However, since the stacking order of the layers is arbitrary, the photoelectric conversion layer having sensitivity to near infrared light can be defined as the "first photoelectric conversion layer 121", and the photoelectric conversion layer having sensitivity to blue, green, or red light can be defined as the "second photoelectric conversion layer 122". In this case, in the pixels 10 that are adjacent to each other, the distance between the first plugs 31 is much smaller than the distance between the first plug 31 and the second plug 32.

The technical ideas described above in the first to fifth embodiments can also be applied to an imaging device having only one photoelectric conversion layer.

Sixth Embodiment

Figure 16:
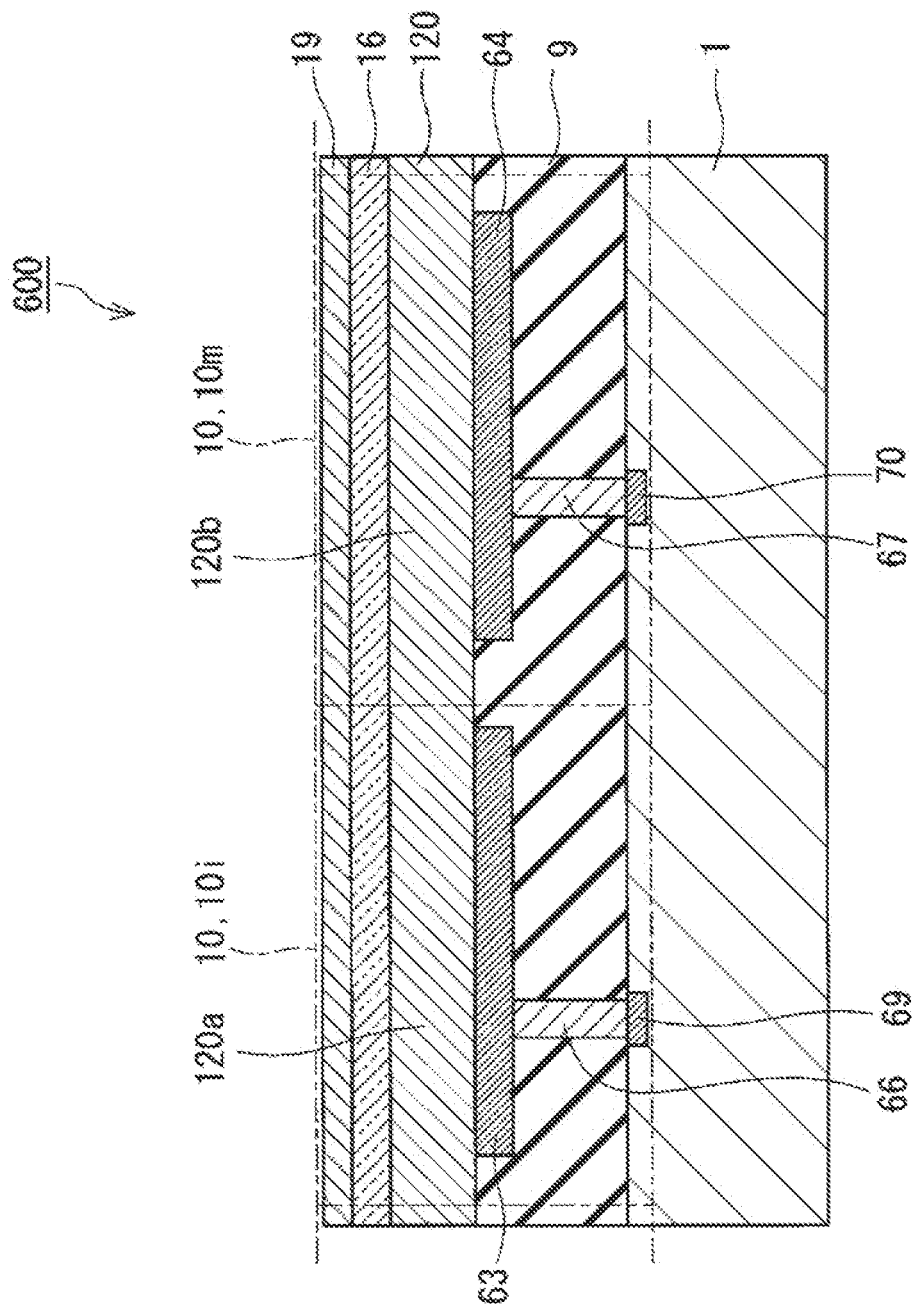
FIG. 16 is a diagram illustrating a sectional view of an imaging device according to a sixth embodiment of the present disclosure.

FIG. 16 illustrates a cross section of an imaging device 600 according to a sixth embodiment of the present disclosure. The imaging device 600 has only one photoelectric conversion layer 120. In the present embodiment, the plurality of pixels 10 includes, for example, sub-pixels 10$i$, which are first pixels, and sub-pixels 10$m$, which are second pixels. The sub-pixels 10$i$, which are the first pixels, are pixels having sensitivity to the wavelength range of near infrared light. Specifically, the sub-pixels 10$i$, which the first pixels, are pixels for forming an image based on near infrared light. The sub-pixels 10$m$, which are the second pixels, are pixels having sensitivity to the wavelength range of visible light. Specifically, the sub-pixels 10$m$, which are the second pixels, are pixels for forming an image based on grayscale light (i.e., only lightness). The photoelectric conversion layer 120 can be fabricated using a mixed material of photoelectric conversion material having sensitivity to the wavelength range of visible light and photoelectric conversion material having sensitivity to the wavelength range of near infrared light. The single photoelectric conversion layer 120 may be formed by stacking a layer made of photoelectric conversion material having sensitivity to the wavelength range of visible light and a layer made of photoelectric conversion material having sensitivity to the wavelength range of near infrared light. A filter 19 cuts incidence of visible light on the photoelectric conversion layer 120 in the sub-pixels 10$i$, which are the first pixels, and cuts incidence of near infrared light on the photoelectric conversion layer 120 in the sub-pixels 10$m$, which are the second pixels.

The photoelectric conversion layer 120 includes first photoelectric conversion layers 120$a$ and second photoelectric conversion layers 120$b$. The first photoelectric conversion layers 120$a$ and the second photoelectric conversion layers 120$b$ constitute respective portions of the continuous photoelectric conversion layer 120. Of the photoelectric conversion layer 120, the first photoelectric conversion layers 120$a$ are portions included in the sub-pixels 10$i$, which are the first pixels. Of the photoelectric conversion layer 120, the second photoelectric conversion layers 120$b$ are portions included in the sub-pixels 10$m$, which are the second pixels. In the pixels 10 that are adjacent to each other, the photoelectric conversion layer 120 may be spatially separated into a plurality of portions. That is, the first photoelectric conversion layers 120$a$ and the second photoelectric conversion layers 120$b$ may be separated from each other.

Each of the sub-pixels 10$i$, which are the first pixels, has the first photoelectric conversion layer 120$a$, a first pixel electrode 63, and a first plug 66. The first pixel electrode 63 is electrically connected to the first photoelectric conversion layer 120$a$ to collect charge corresponding to light in the first wavelength range. The first wavelength range is the wavelength range of near infrared light. The first plug 66 provides electrical connection between the semiconductor substrate 1 and the first pixel electrode 63. One end of the first plug 66 is connected to a charge accumulation region 69.

Each of the sub-pixels 10$m$, which are the second pixels, has the second photoelectric conversion layer 120$b$, a second pixel electrode 64, and a second plug 67. The second pixel electrode 64 is electrically connected to the second photoelectric conversion layer 120$b$ to collect charge corresponding to light in the second wavelength range. The second wavelength range is the wavelength range of visible light. The second plug 67 provides electrical connection between the semiconductor substrate 1 and the second pixel electrode 64. One end of the second plug 67 is connected to a charge accumulation region 70.

Figure 17:
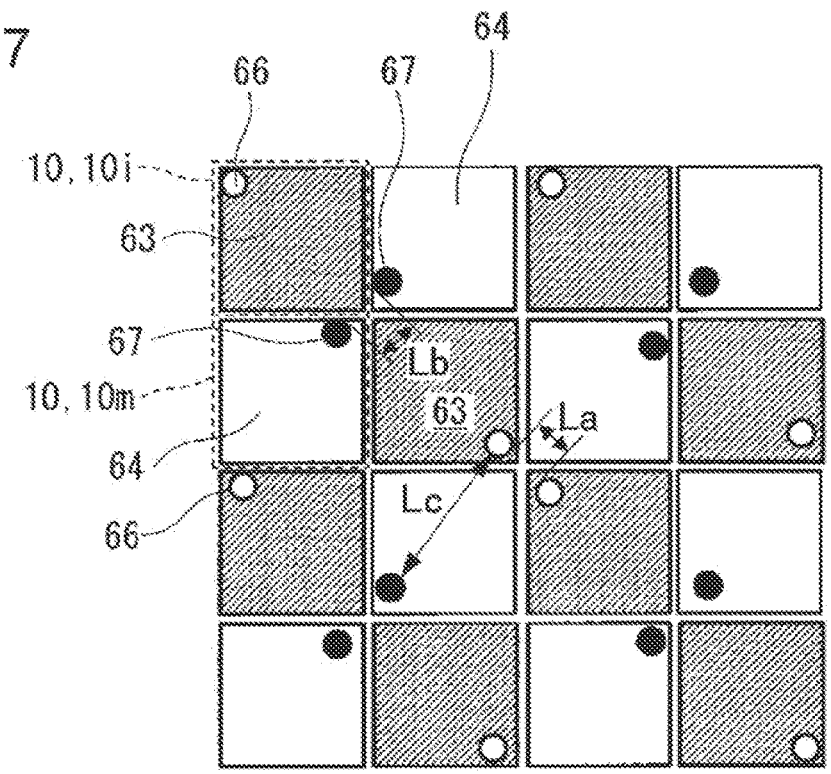
FIG. 17 is a diagram illustrating an arrangement of the pixel electrodes and the plugs when the imaging device according to the sixth embodiment is viewed in the normal direction of the semiconductor substrate.

FIG. 17 illustrates an arrangement of the first pixel electrodes 63, the second pixel electrodes 64, the first plugs 66, and the second plugs 67 when the imaging device 600 is viewed in the normal direction of the semiconductor substrate 1. In the present embodiment, the sub-pixels 10$i$, which are the first pixels, and the sub-pixels 10$m$, which are the second pixels, are arrayed in a two-color checkerboard pattern. A distance La between the first plugs 66 in the sub-pixels 10$i$ that are adjacent to each other is smaller than a distance Lc between the first plug 66 in the sub-pixel 10$i$, which is the first pixel, and the second plug 67 in the sub-pixel 10$m$, which is the second pixel that is adjacent to the first pixel. The distance La between the first plugs 66 in the sub-pixels 10$i$ that are adjacent to each other, the sub-pixels 10$i$ being the first pixels, is, for example, equal to a distance Lb between the second plugs 67 in the sub-pixels 10$m$ that are adjacent to each other, the sub-pixels 10$m$ being the second pixels. In the present embodiment, it is also possible to suppress crosstalk between the plugs corresponding to different colors.

Third Modification

A Bayer arrangement can also be applied to the imaging device 600 illustrated in FIG. 16. Specifically, the color the filter 19 can be a Bayer filter, and the photoelectric conversion layer 120 can be made of photoelectric conversion material having sensitivity to visible light. In this case, the pixels 10 in the imaging device 600 include G pixels 10$gg$, which are first pixels, B pixels 10$bb$, which are second pixels, and R pixels 10$rr$, which are third pixels. The first pixel electrodes 63 collects charge corresponding to light in the first wavelength range. The first wavelength range is the wavelength range of green light. The second pixel electrode 64 collects charge corresponding to light in the second wavelength range. The second wavelength range is the wavelength range of blue light.

Figure 18:
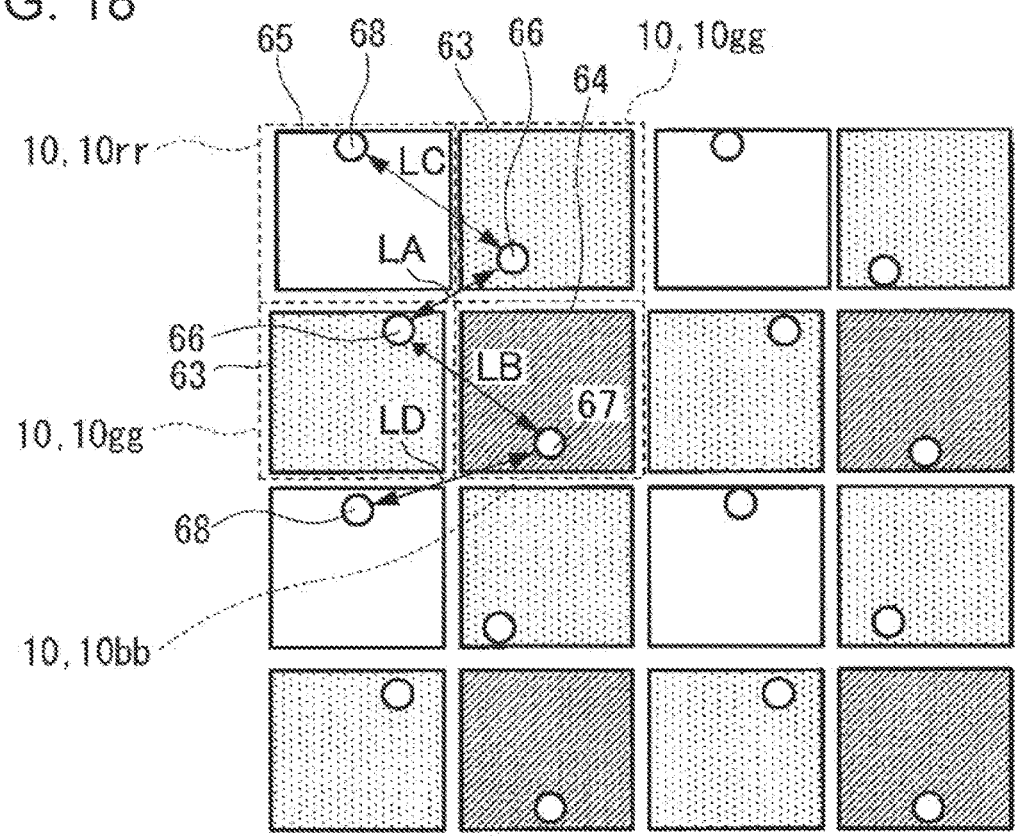
FIG. 18 is a diagram illustrating an arrangement of the pixel electrodes and the plugs when a Bayer arrangement is applied to the imaging device according to the sixth embodiment.

FIG. 18 illustrates an arrangement of the first pixel electrodes 63, the second pixel electrodes 64, third pixel electrodes 65, the first plugs 66, the second plugs 67, and third plugs 68 when a Bayer arrangement is applied to the imaging device 600. The G pixels 10$gg$, which are the first pixels, the B pixels 10$bb$, which are the second pixels, and the R pixels 10rr, which are the third pixels, are arrayed in a Bayer arrangement. The imaging device 600 can acquire full-color images.

The R pixels 10rr, which are the third pixels, have the photoelectric conversion layer 120, the third pixel electrodes 65 the third plugs 68. The third pixel electrodes 65 are electrically connected to the photoelectric conversion layer 120 to collect charge corresponding to light in the third wavelength range. The third wavelength range is the wavelength range of red light. The third plug 68 provides electrical connection between the semiconductor substrate 1 and the third pixel electrode 65.

A distance LA between the first plugs 66 in the G pixels 10gg that are adjacent to each other is smaller than a distance LB between the first plug 66 and the second plug 67 in the G pixel 10gg and the B pixel 10bb that are adjacent to each other. According to this configuration, crosstalk between the first plug 66 in the G pixel 10gg, which is the first pixel, and the second plug 67 in the B pixel 10bb, which is the second pixel, is suppressed. As a result, it is possible to suppress color mixing of blue and green. That is, color separation can be enhanced.

Also, the distance LA between the first plugs 66 is smaller than a distance LC between the first plug 66 and the third plug 68 in the G pixel 10gg and the R pixel 10rr that are adjacent to each other. According to this configuration, crosstalk between the first plug 66 in the G pixel 10gg, which is the first pixel, and the third plug 68 in the R pixel 10rr, which is the third pixel, is suppressed. As a result, it is possible to suppress color mixing of red and green. That is, color separation can be enhanced.

Also, the distance LA between the first plugs 66 is smaller than a distance LD between the second plug 67 and the third plug 68 in the B pixel 10bb and the R pixel 10rr that are adjacent to each other. According to this configuration, crosstalk between the first plug 66 in the G pixel 10gg and the plug in another pixel is particularly suppressed.

According to the above-described configuration, it is possible to suppress mixing of different colors, that is red, green, and blue. In the present embodiment, the crosstalk suppression effect is the highest in the G pixels 10gg. Since the G pixels 10gg occupy an area that is equal to the total area of the B pixels 10bb and the R pixels 10rr, suppressing crosstalk between the first plugs 66 in the G pixels 10gg offers an advantage of most effectively suppressing the color mixing.

Also, suppressing crosstalk between the first plug 66 in the G pixel 10gg having a high luminosity factor and the plug in the pixel for another color makes it possible to effectively suppress color mixing of different colors.

Seventh Embodiment

Figure 19:
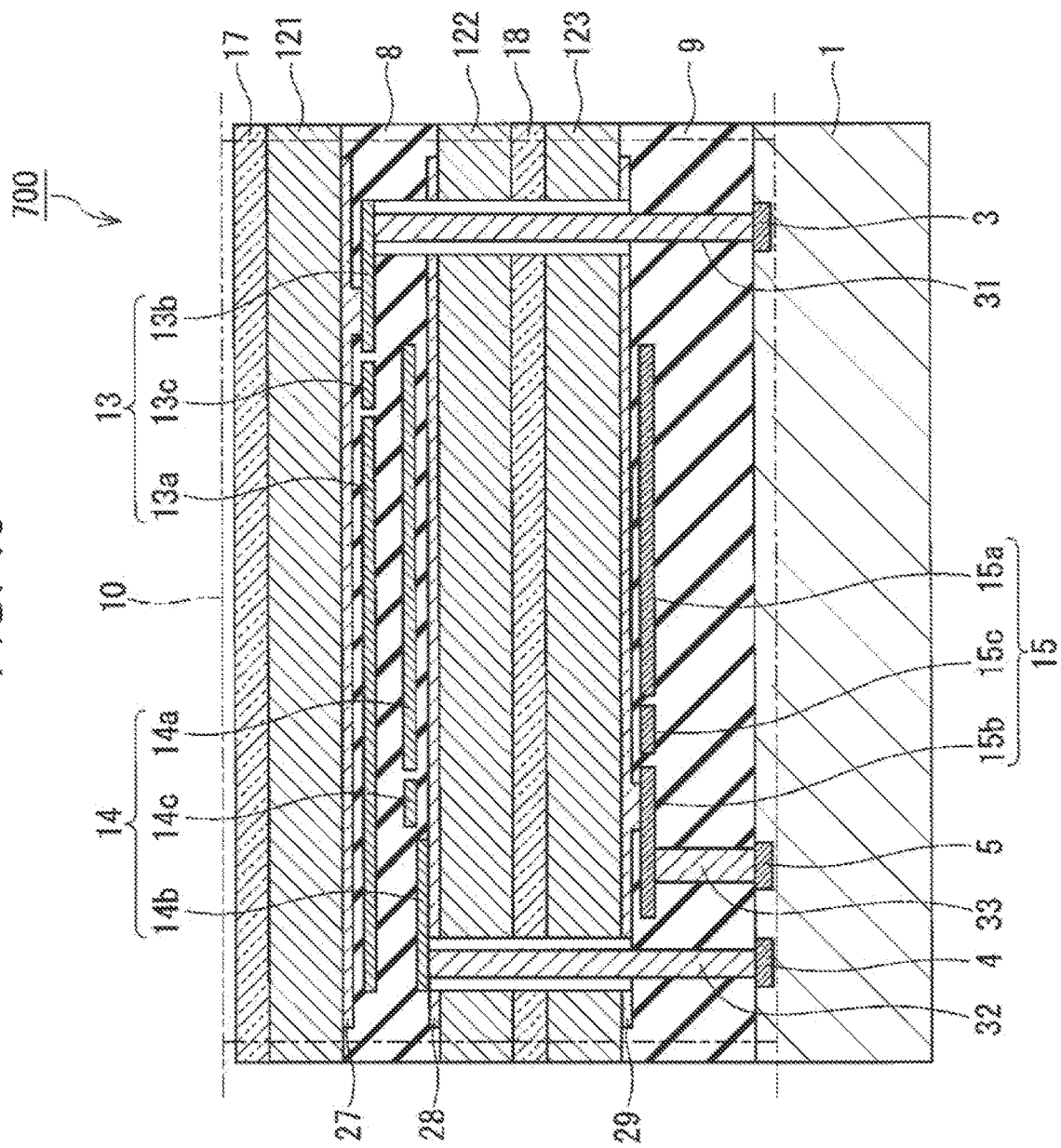
FIG. 19 is a sectional view of an imaging device according to a seventh embodiment of the present disclosure.

FIG. 19 illustrates a cross section of an imaging device 700 according to a seventh embodiment of the present disclosure. The imaging device 700 and the imaging device in each embodiment described above differ from each other in the structure of electrodes. In the imaging device 700, each first pixel electrode 13 has a first accumulation electrode 13a, a first readout electrode 13b, and a first transfer electrode 13c. Each second pixel electrode 14 has a second accumulation electrode 14a, a second readout electrode 14b, and a second transfer electrode 14c. Each third pixel electrode 15 has a third accumulation electrode 15a, a third readout electrode 15b, and a third transfer electrode 15c. The first transfer electrode 13c, the second transfer electrode 14c, and the third transfer electrode 15c may be omitted.

A first semiconductor layer 27 is provided between the first pixel electrode 13 and the first photoelectric conversion layer 121. Part of the insulating layer 8 lies between the first semiconductor layer 27 and the first pixel electrode 13. A second semiconductor layer 28 is provided between the second pixel electrode 14 and the second photoelectric conversion layer 122. Part of the insulating layer 8 lies between the second semiconductor layer 28 and the second pixel electrode 14. A third semiconductor layer 29 is provided between the third pixel electrode 15 and the third photoelectric conversion layer 123. Part of the insulating layer 9 lies between the third semiconductor layer 29 and the third pixel electrode 15. The first semiconductor layer 27, the second semiconductor layer 28, and the third semiconductor layer 29 are provided in order to more efficiently accumulate charge and are made of semiconductor material that is light transmissive.

The first accumulation electrode 13a and the first transfer electrode 13c face the first photoelectric conversion layer 121 with part of the insulating layer 8 being interposed therebetween or part of the insulating layer 8 and the first semiconductor layer 27 being interposed therebetween. At least part of the first readout electrode 13b is in contact with the first photoelectric conversion layer 121 directly or via the first semiconductor layer 27. The first plug 31 is connected to the first readout electrode 13b. The first accumulation electrode 13a, the first readout electrode 13b, and the first transfer electrode 13c are electrically connected to corresponding wires, which are not illustrated. A desired voltage can be applied to each of the first accumulation electrode 13a, the first readout electrode 13b, and the first transfer electrode 13c. The first accumulation electrode 13a can serve as an electrode for charge accumulation, that is, an electrode for attracting charge generated in the first photoelectric conversion layer 121 in response to the applied voltage and for causing the charge to be accumulated at the first photoelectric conversion layer 121. The first transfer electrode 13c is arranged between the first accumulation electrode 13a and the first readout electrode 13b when the imaging device 700 is viewed in plan view. The first transfer electrode 13c plays a role in blocking the accumulated charge and controlling transfer of the charge. Controlling voltages applied to the first accumulation electrode 13a, the first readout electrode 13b, and the first transfer electrode 13c allows charge generated in the first photoelectric conversion layer 121 to be accumulated inside the first photoelectric conversion layer 121 or at an interface of the first photoelectric conversion layer 121 and allows the generated charge to be taken out to the first charge accumulation region 3. The above descriptions of the first pixel electrode 13 can also be applied to the second pixel electrode 14 and the third pixel electrode 15 by replacing "first" with "second" or "third".

According to the structure of the electrodes in the present embodiment, charge that is generated in the photoelectric conversion layer can be efficiently collected and transferred, which leads to an improvement in the sensitivity. The structure of the electrodes in the present embodiment can be applied to all the embodiments described above.

The technology disclosed herein is useful for imaging devices. The imaging devices can be applied to imaging apparatuses, optical sensors, and so on.

What is claimed is:

1. An imaging device comprising:
a semiconductor substrate;
a first pixel; and
second pixels that are adjacent to the first pixel, wherein:
each of the first pixel and the second pixels includes:
a first photoelectric conversion layer that converts light having a wavelength included in a first wavelength range into first charges;
a first pixel electrode that collects the first charges and is disposed on a bottom surface of the first photoelectric conversion layer facing the substrate;
a first plug through which the first pixel electrode is electrically connected to the semiconductor substrate;
a second photoelectric conversion layer that is arranged above the first photoelectric conversion layer or between the first photoelectric conversion layer and the semiconductor substrate in a normal direction of the semiconductor substrate and that converts light in a wavelength included in a second wavelength range into second charges;
a second pixel electrode that collects the second charges and is disposed on an upper surface of the second photoelectric conversion layer; and
a second plug through which the second pixel electrode is electrically connected to the semiconductor substrate, the second plug being in direct contact with a bottom surface of the second pixel electrode, and,
when viewed in the normal direction of the semiconductor substrate, a smallest distance of distances between the first plug in the first pixel and a plurality of first plugs in the second pixels is smaller than a smallest distance of distances between the first plug in the first pixel and a plurality of second plugs in the first pixel and the second pixels, each of the plurality of first plugs being the first plug in a corresponding one of the second pixels, each of the plurality of second plugs being the second plug in the first pixel or the second plug in a corresponding one of the second pixels.

2. The imaging device according to claim 1,
wherein, in the normal direction of the semiconductor substrate, the second photoelectric conversion layer is arranged above the first photoelectric conversion layer.

3. The imaging device according to claim 2, wherein
the first wavelength range is a wavelength range of near infrared light, and
the second wavelength range is a wavelength range of visible light.

4. The imaging device according to claim 1,
wherein the second photoelectric conversion layer is arranged between the first photoelectric conversion layer and the semiconductor substrate in the normal direction of the semiconductor substrate.

5. The imaging device according to claim 4, wherein
the first wavelength range is a wavelength range of visible light, and
the second wavelength range is a wavelength range of near infrared light.

6. The imaging device according to claim 4,
wherein, when viewed in the normal direction of the semiconductor substrate, the first plug does not overlap the second pixel electrode.

7. The imaging device according to claim 4,
wherein, when viewed in the normal direction of the semiconductor substrate, an area of the second pixel electrode is smaller than four times an area of the first pixel electrode.

8. The imaging device according to claim 1, wherein:
the first pixel electrode includes:
a first accumulation electrode that causes the first charges to be accumulated at the first photoelectric conversion layer, and
a first readout electrode that is electrically connected to the semiconductor substrate via the first plug, and
the second pixel electrode includes:
a second accumulation electrode that causes the second charges to be accumulated at the second photoelectric conversion layer, and
a second readout electrode that is electrically connected to the semiconductor substrate via the second plug.

9. The imaging device according to claim 1, wherein the second pixel electrode is a single layer.

10. An imaging device, comprising:
a semiconductor substrate;
a first pixel; and
second pixels that are adjacent to the first pixel, wherein:
each of the first pixel and the second pixels includes:
a first photoelectric conversion layer that converts light having a wavelength included in a first wavelength range into first charges;
a first pixel electrode that collects the first charges;
a first plug through which the first pixel electrode is electrically connected to the semiconductor substrate;
a second photoelectric conversion layer that is arranged above the first photoelectric conversion layer or between the first photoelectric conversion layer and the semiconductor substrate in a normal direction of the semiconductor substrate and that converts light in a wavelength included in a second wavelength range into second charges;
a second pixel electrode that collects the second charges; and
a second plug through which the second pixel electrode is electrically connected to the semiconductor substrate,
when viewed in the normal direction of the semiconductor substrate, a smallest distance of distances between the first plug in the first pixel and a plurality of first plugs in the second pixels is smaller than a smallest distance of distances between the first plug in the first pixel and a plurality of second plugs in the first pixel and the second pixels, each of the plurality of first plugs being the first plug in a corresponding one of the second pixels, each of the plurality of second plugs being the second plug in the first pixel or the second plug in a corresponding one of the second pixels,
the first wavelength range includes a wavelength range of red light and a wavelength range of blue light,
the second wavelength range includes a wavelength range of green light,
the first photoelectric conversion layer has sensitivity to the wavelength range of red light and the wavelength range of blue light, and
the second photoelectric conversion layer has sensitivity to the wavelength range of green light.

11. The imaging device according to claim 10, further comprising:
  a first color filter that cuts light in the wavelength range of red light; and
  a second color filter that cuts light in the wavelength range of blue light.

12. An imaging device, comprising:
  a semiconductor substrate;
  a first pixel; and
  second pixels that are adjacent to the first pixel, wherein:
  each of the first pixel and the second pixels includes:
    a first photoelectric conversion layer that converts light having a wavelength included in a first wavelength range into first charges;
    a first pixel electrode that collects the first charges;
    a first plug through which the first pixel electrode is electrically connected to the semiconductor substrate;
    a second photoelectric conversion layer that is arranged above the first photoelectric conversion layer or between the first photoelectric conversion layer and the semiconductor substrate in a normal direction of the semiconductor substrate and that converts light in a wavelength included in a second wavelength range into second charges;
    a second pixel electrode that collects the second charges;
    a second plug through which the second pixel electrode is electrically connected to the semiconductor substrate;
    a third photoelectric conversion layer that converts light having a wavelength included in a third wavelength range into third charges;
    a third pixel electrode that collects the third charges; and
    a third plug through which the third pixel electrode is electrically connected to the semiconductor substrate,
  when viewed in the normal direction of the semiconductor substrate, a smallest distance of distances between the first plug in the first pixel and a plurality of first plugs in the second pixels is smaller than a smallest distance of distances between the first plug in the first pixel and a plurality of second plugs in the first pixel and the second pixels, each of the plurality of first plugs being the first plug in a corresponding one of the second pixels, each of the plurality of second plugs being the second plug in the first pixel or the second plug in a corresponding one of the second pixels,
  when viewed in the normal direction of the semiconductor substrate, the smallest distance of the distances between the first plug in the first pixel and the plurality of first plugs in the second pixels is smaller than a smallest distance of distances between the first plug in the first pixel and a plurality of third plugs in the second pixels, each of the plurality of third plugs being the third plug in a corresponding one of the second pixels,
  the third photoelectric conversion layer is closer to the semiconductor substrate than both the first photoelectric conversion layer and the second photoelectric conversion layer, and
  when viewed in the normal direction of the semiconductor substrate, the smallest distance of the distances between the first plug in the first pixel and the plurality of second plugs in the first pixel and the second pixels is larger than the smallest distance of the distances between the first plug in the first pixel and the plurality of third plugs in the first pixel and the second pixels.

13. An imaging device comprising:
  a semiconductor substrate;
  two first pixels that are adjacent to each other;
  a second pixel that is adjacent to each of the two first pixels; and
  a third pixel that is adjacent to each of the two first pixels, wherein:
  each of the two first pixels includes:
    a first photoelectric conversion layer that converts light having a wavelength included in a first wavelength range into first charges,
    a first pixel electrode that collects the first charges, and
    a first plug through which the first pixel electrode is electrically connected to the semiconductor substrate,
  the second pixel includes:
    a second photoelectric conversion layer that converts light having a wavelength included in a second wavelength range into second charges,
    a second pixel electrode that collects the second charges, and
    a second plug through which the second pixel electrode is electrically connected to the semiconductor substrate,
  the third pixel includes:
    a third photoelectric conversion layer that converts light having a wavelength included in a third wavelength range into third charges,
    a third pixel electrode that collects the third charges, and
    a third plug through which the third pixel electrode is electrically connected to the semiconductor substrate,
  when viewed in a normal direction of the semiconductor substrate, a distance between the first plug in one of the two first pixels and the first plug in the other of the two first pixels is smaller than a distance between the first plug in one of the two first pixels and the second plug in the second pixel,
  when viewed in the normal direction of the semiconductor substrate, the distance between the first plug in one of the two first pixels and the first plug in the other of the two first pixels is smaller than a distance between the first plug in one of the two first pixels and the third plug in the third pixel,
  a distance between the first photoelectric conversion layer and the semiconductor substrate is equal to a distance between the second photoelectric conversion layer and the semiconductor substrate, and is equal to a distance between the third photoelectric conversion layer and the semiconductor substrate,
  the first photoelectric conversion layer in a first pixel of the two first pixels is in direct contact with the second photoelectric conversion layer, and
  at least one of the first photoelectric conversion layer and the second photoelectric conversion layer presents on a boundary line on which the first pixel and the second pixel adjoin each other when viewed in the normal direction of the semiconductor substrate.

14. The imaging device according to claim 13, wherein the two first pixels, the second pixel, and the third pixel are arrayed in a Bayer arrangement.

15. The imaging device according to claim 13, wherein the first wavelength range is a wavelength range of green light.

16. The imaging device according to claim 13,
wherein the first photoelectric conversion layer is adjacent to the second photoelectric conversion layer in a first horizontal direction that is perpendicular to the normal direction of the semiconductor substrate, and
the first photoelectric conversion layer is adjacent to the third photoelectric conversion layer in a second horizontal direction that is perpendicular to the normal direction of the semiconductor substrate.

17. The imaging device according to claim 13,
wherein when viewed in the normal direction of the semiconductor substrate, the two first pixels, the second pixel and the third pixel are arranged in a 2×2 matrix, and the two first pixels are positioned diagonally across the 2×2 matrix.

* * * * *